(12) United States Patent
Gabara

(10) Patent No.: US 7,786,836 B2
(45) Date of Patent: Aug. 31, 2010

(54) FABRICATION OF INDUCTORS IN TRANSFORMER BASED TANK CIRCUITRY

(75) Inventor: Thaddeus John Gabara, Murray Hill, NJ (US)

(73) Assignee: LCtank LLC, Murray Hills, NJ (US)

(*) Notice: Subject to any disclaimer, the term of this patent is extended or adjusted under 35 U.S.C. 154(b) by 513 days.

(21) Appl. No.: 11/184,767

(22) Filed: Jul. 19, 2005

(65) Prior Publication Data
US 2007/0018767 A1    Jan. 25, 2007

(51) Int. Cl.
*H01F 5/00*    (2006.01)
(52) U.S. Cl. ...................................... 336/200
(58) Field of Classification Search .............. 336/65, 336/83, 200, 206–208, 232; 257/531
See application file for complete search history.

(56) References Cited

U.S. PATENT DOCUMENTS

| | | | |
|---|---|---|---|
| 3,181,096 A * | 4/1965 | Werner | ........................ 336/69 |
| 4,286,704 A | 9/1981 | Wood | |
| 4,816,784 A * | 3/1989 | Rabjohn | ................... 333/24 R |
| 4,992,769 A * | 2/1991 | Oppelt | ........................ 336/180 |
| 5,396,195 A | 3/1995 | Gabara | |
| 5,477,204 A | 12/1995 | Li | |
| 5,831,331 A | 11/1998 | Lee | |
| 5,872,489 A | 2/1999 | Chang | |
| 5,966,063 A | 10/1999 | Sato | |
| 6,060,759 A | 5/2000 | Dhong | |
| 6,225,677 B1 | 5/2001 | Kobayashi | |
| 6,274,937 B1 * | 8/2001 | Ahn et al. | ................... 257/777 |
| 6,304,146 B1 | 10/2001 | Welland | |
| 6,323,735 B1 | 11/2001 | Welland | |
| 6,404,317 B1 * | 6/2002 | Mizoguchi et al. | .......... 336/200 |
| 6,480,086 B1 | 11/2002 | Kluge et al. | |
| 6,529,385 B1 * | 3/2003 | Brady et al. | ................. 361/766 |
| 6,580,334 B2 * | 6/2003 | Simburger et al. | ........ 333/24 R |
| 6,608,364 B2 * | 8/2003 | Carpentier | ................... 257/531 |
| 6,621,358 B2 | 9/2003 | Carballo | |
| 6,621,365 B1 | 9/2003 | Hallivuori | |

(Continued)

OTHER PUBLICATIONS

Mohan et al., Simple Accurate Expressions for Planar Sprial Inductances, IEEE J. of Solid-state Circuits, vol. 34, No. 10, Oct. 1999, pp. 1419-1424.

(Continued)

*Primary Examiner*—Tuyen Nguyen
(74) *Attorney, Agent, or Firm*—Thaddeus Gabara

(57) ABSTRACT

Placing inductors or resistors in parallel causes the combined value of inductance or resistance to decrease according to the parallel combination rule. This invention decreases the parasitic resistance of an inductor by placing several inductors in parallel. Furthermore, by careful placement of these inductors, the mutual inductance between these inductors can be used to increase the equivalent inductance value to a value near that of the original inductance value of a single inductor. Thus, it is possible to create an inductance with a much lower value of parasitic resistance. This invention allows the formation of high Q inductors and would be beneficial in any circuit design requiring inductances. Another aspect of this invention is that the coils can be partitioned to minimize eddy current losses. This invention can easily be implemented in a planar technology. Simulations of several tank circuits indicate that the power dissipation can be reduced 3 to 4 times when compared to conventional techniques.

18 Claims, 33 Drawing Sheets

U.S. PATENT DOCUMENTS

| | | | |
|---|---|---|---|
| 6,650,220 B2 | 11/2003 | Sia | |
| 6,661,325 B2 | 12/2003 | Suh | |
| 6,714,086 B1 | 3/2004 | Landrith | |
| 6,759,937 B2 | 7/2004 | Kyriazidou | |
| 6,794,977 B2 * | 9/2004 | Christensen | 336/200 |
| 6,867,677 B2 * | 3/2005 | Nielson | 336/200 |
| 6,885,090 B2 * | 4/2005 | Franzon et al. | 257/678 |
| 6,891,444 B2 | 5/2005 | Jacobsson | |
| 6,911,870 B2 | 6/2005 | Gierkink | |
| 6,943,635 B1 | 9/2005 | Kaltenecker | |
| 6,982,805 B2 | 1/2006 | Mondal | |
| 7,005,930 B1 | 2/2006 | Kim | |
| 7,038,443 B2 | 5/2006 | Proksch | |
| 7,068,139 B2 * | 6/2006 | Harris et al. | 336/200 |
| 7,078,998 B2 | 7/2006 | Zhang | |
| 7,109,810 B2 | 9/2006 | Senthilkumar | |
| 7,138,877 B2 | 11/2006 | Vu | |
| 7,317,354 B2 | 1/2008 | Lee | |
| 7,355,264 B2 * | 4/2008 | Degani et al. | 257/531 |
| 2001/0007437 A1 | 7/2001 | Mashimo | |
| 2003/0206067 A1 | 11/2003 | Wong | |
| 2008/0265367 A1 * | 10/2008 | Tan et al. | 257/531 |

OTHER PUBLICATIONS

M.E. Van Valkenburg, Network Analysis, Third Edition, 1974, ISBN 0-13-611095-9, Prentice-Hall, Inc., Englewood Cliff, NJ, USA, pp. 38-42.

Niknejad et al., Analysis of Eddy-Current Losses Over Conductive Substrates with Applications to Monolithic Inductors and Transformers, IEEE Trans. Microwave Theory Tech, vol. 49, No. 1, Jan. 2001, pp. 166-176.

* cited by examiner

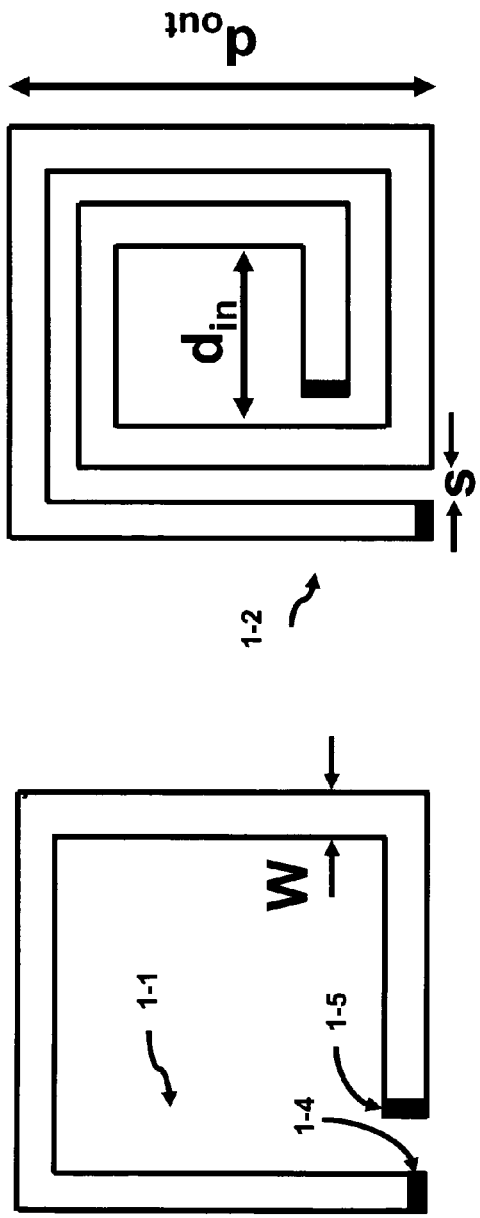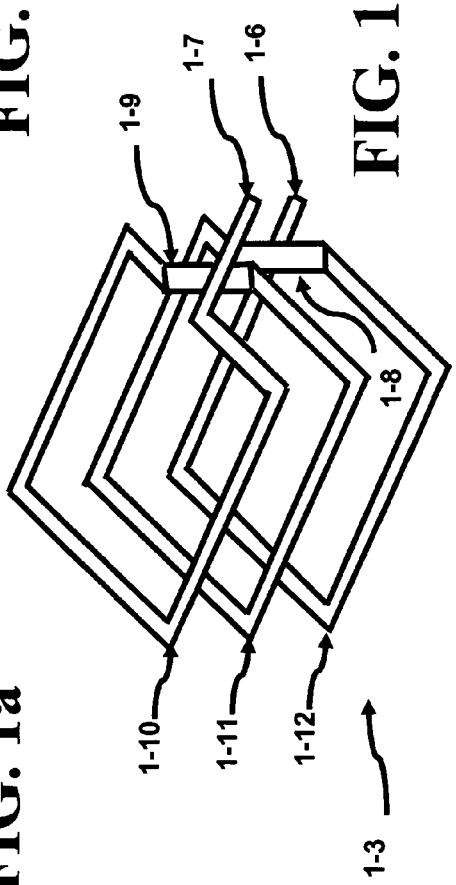
FIG. 1a
FIG. 1b
FIG. 1c

| L (nH) | N (turns) | $D_{out}$ (μm) | $D_{in}$ (μm) | W (μm) | S (μm) | SQ (□'s) | Resistor Ratio |
|---|---|---|---|---|---|---|---|
| 0.8 | 2 | 200 | 120 | 15 | 10 | 82 | 1 |
| 1.6 | 4 | 200 | 20 | 15 | 10 | 112 | 1.37 |
| 0.85 | 2.06 | 200 | 120- | 15 | 10 | 83.4 | 1.017 |
| 0.857 | 2.07 | 200 | 120- | 15 | 10 | 83.6 | 1.019 |
| 0.865 | 2.08 | 200 | 120- | 15 | 10 | 83.8 | 1.02 |

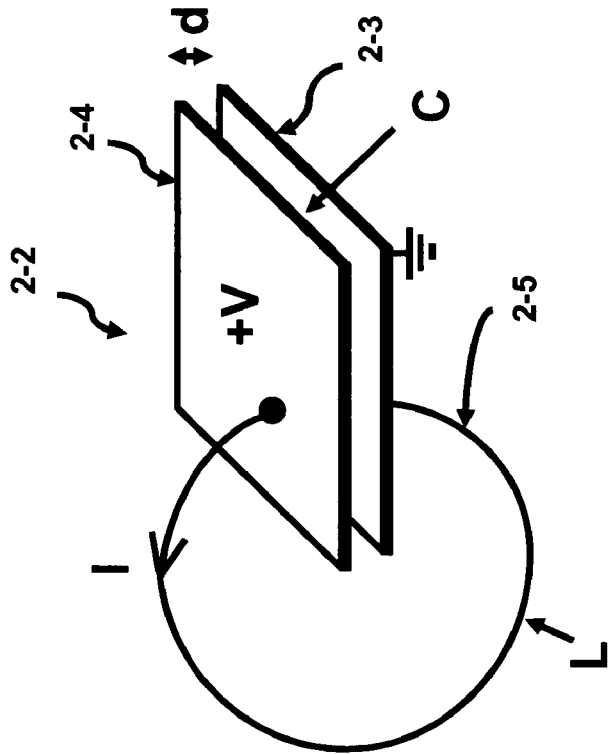
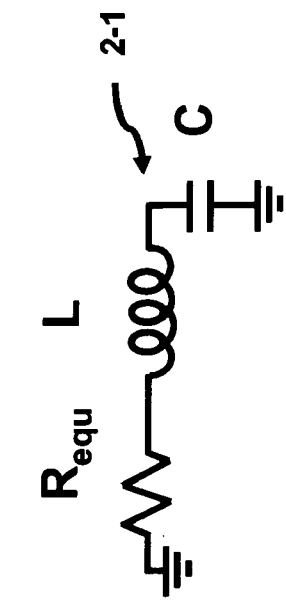
FIG. 2a
FIG. 2b
FIG. 2c

| L | $R_{equ}$ | $C_1$ | $C_2$ | $C_{tot}$ | $C_{ref}$ | $C_{equ}$ | $\dfrac{R_{equ}}{R_{ref}}$ | f |
|---|---|---|---|---|---|---|---|---|
| 0.8n | R | 64p | 64p | 128p | 128p | 32p | 1 | 1GHz |
| 0.8n | R | 2.6p | 2.6p | 5.2p | 5.2p | 1.3p | 1 | 5GHz |
| 0.8n | R | 0.64p | 0.64p | 1.28p | 1.28p | 0.32p | 1 | 10GHz |

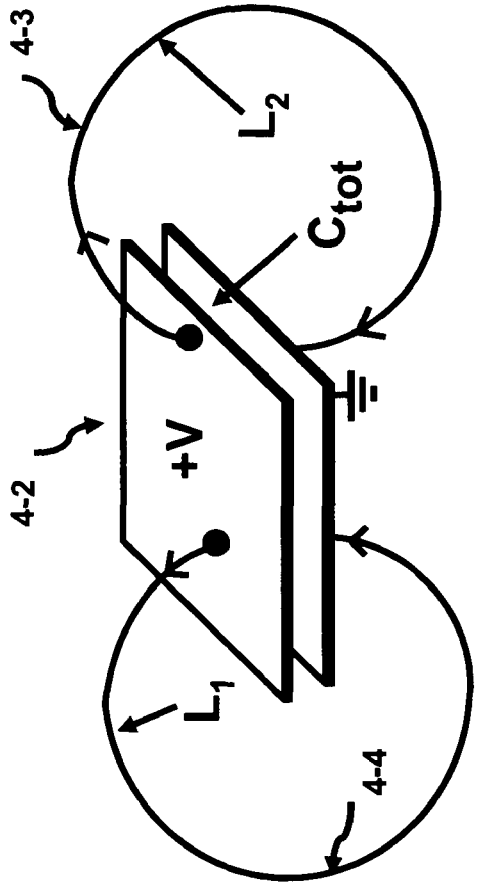
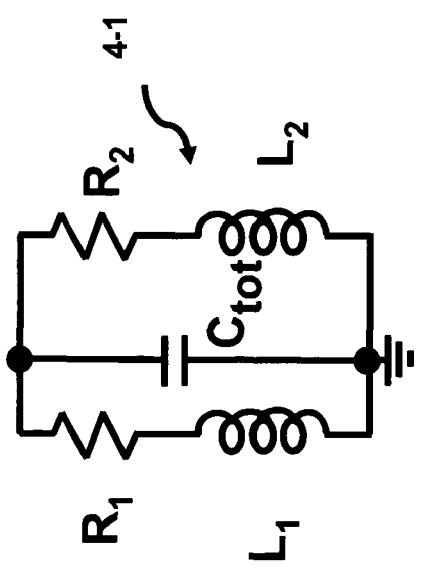
| $L_1$ | $L_2$ | $L_{equ}$ | $R_1$ | $R_2$ | $R_{equ}$ | $C_{tot}$ | $\dfrac{R_{equ}}{R_{ref}}$ | f |
|---|---|---|---|---|---|---|---|---|
| 1.6n | 1.6n | 0.8n | 1.37R | 1.37R | 0.69R | 32p | 0.69 | 1GHz |
| 1.6n | 1.6n | 0.8n | 1.37R | 1.37R | 0.69R | 1.3p | 0.69 | 5GHz |
| 1.6n | 1.6n | 0.8n | 1.37R | 1.37R | 0.69R | 0.32p | 0.69 | 10GHz |
FIG. 4a
FIG. 4b
FIG. 4c

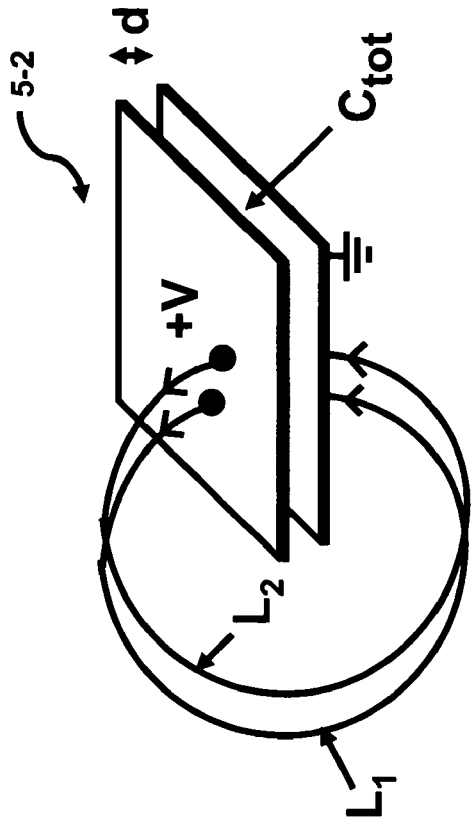
FIG. 5a
FIG. 5b
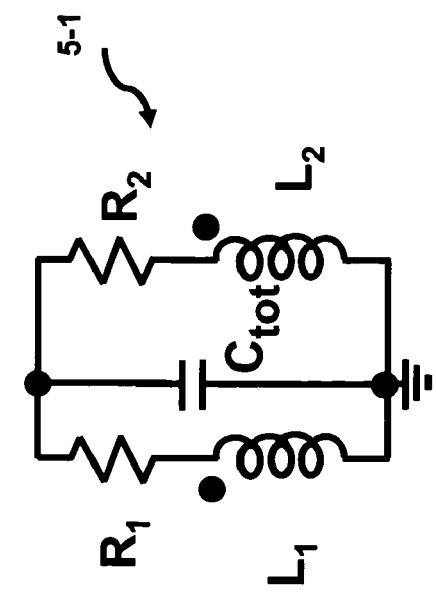
| $L_1$ | $L_2$ | k | $L_{equ}$ | $R_1$ | $R_2$ | $R_{equ}$ | $C_{tot}$ | $\dfrac{R_{equ}}{R_{ref}}$ | f |
|---|---|---|---|---|---|---|---|---|---|
| 1.6n | 1.6n | 0.9 | 1.58n | 1.37R | 1.37R | 0.69R | 16p | 0.69 | 1GHz |
| 1.6n | 1.6n | 0.9 | 1.58n | 1.37R | 1.37R | 0.69R | 0.6p | 0.69 | 5GHz |
| 1.6n | 1.6n | 0.9 | 1.58n | 1.37R | 1.37R | 0.69R | 0.15p | 0.69 | 10GHz |
FIG. 5c

| $L_1$ | $L_2$ | k | $L_{equ}$ | $R_1$ | $R_2$ | $R_{equ}$ | $C_{tot}$ | $\frac{R_{equ}}{R_{ref}}$ | f |
|---|---|---|---|---|---|---|---|---|---|
| 0.85n | 0.85n | 0.9 | 0.8n | 1.017R | 1.017R | 0.51R | 32p | 0.51 | 1GHz |
| 0.85n | 0.85n | 0.9 | 0.8n | 1.017R | 1.017R | 0.51R | 1.3p | 0.51 | 5GHz |
| 0.85n | 0.85n | 0.9 | 0.8n | 1.017R | 1.017R | 0.51R | 0.32p | 0.51 | 10GHz |

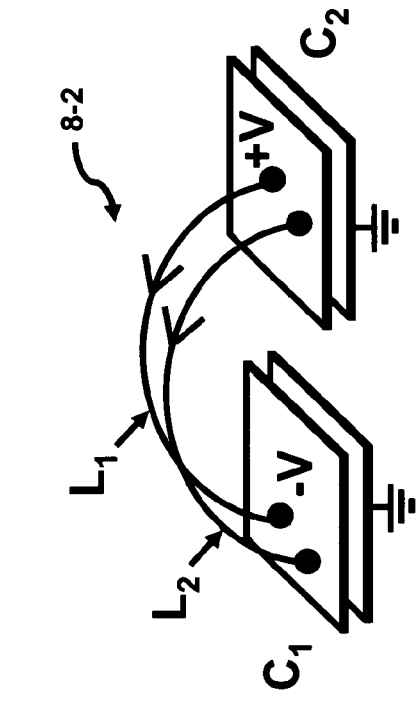
FIG. 8a
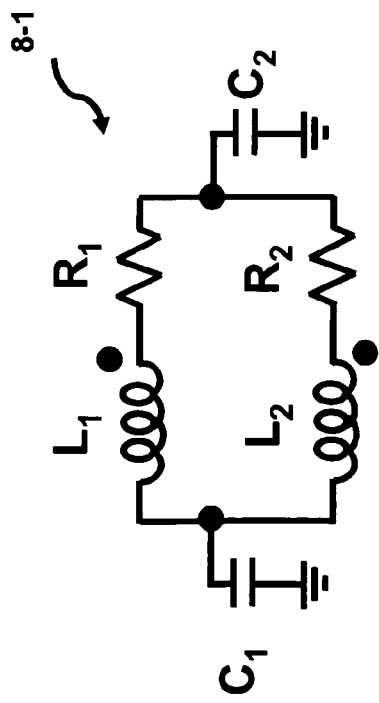
FIG. 8b
| $L_1$ | $L_2$ | k | $L_{equ}$ | $R_1$ | $R_2$ | $R_{equ}$ | $C_1$ | $C_2$ | $C_{equ}$ | $\dfrac{R_{equ}}{R_{ref}}$ | f |
|---|---|---|---|---|---|---|---|---|---|---|---|
| 0.85n | 0.85n | 0.9 | 0.8n | 1.017R | 1.017R | 0.51R | 64p | 64p | 32p | 0.51 | 1GHz |
| 0.85n | 0.85n | 0.9 | 0.8n | 1.017R | 1.017R | 0.51R | 2.6p | 2.6p | 1.3p | 0.51 | 5GHz |
| 0.85n | 0.85n | 0.9 | 0.8n | 1.017R | 1.017R | 0.51R | 0.64p | 0.64p | 0.32p | 0.51 | 10GHz |
FIG. 8c

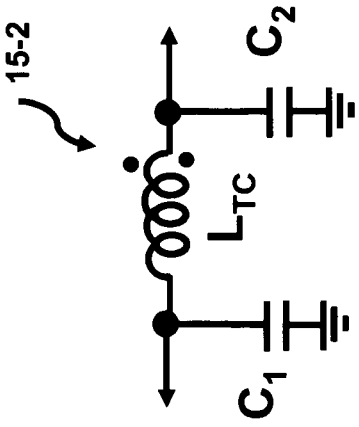
FIG. 15a
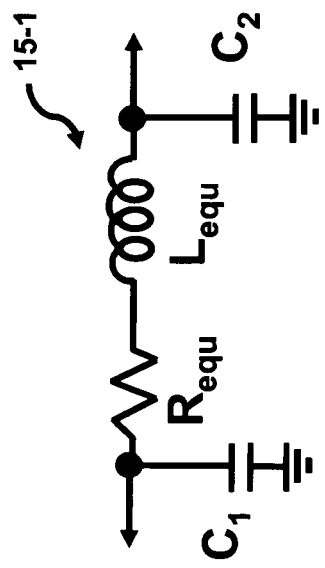
FIG. 15b
| T (coils) | Config (T-T..-T) | N (turns) | L (nH) | k (coup) | $L_{equ}$ (nH) | SQ (□'s) | $R_{coil}$ (Ω) | $R_{equ}$ (Ω) | $Q_{unload}$ (@1GHz) |
|---|---|---|---|---|---|---|---|---|---|
| 1 | N/A | 2 | 0.8 | N/A | 0.8 | 82 | 6.56 | 6.56 | 0.765 |
| 2 | T-T | 2.06 | 0.85 | 0.9 | 0.8 | 83.4 | 6.67 | 3.34 | 1.5 |
| 3 | T-T-T | 2.07 | 0.857 | 0.9 | 0.8 | 83.6 | 6.69 | 2.22 | 2.26 |
| 4 | T-T-T-T | 2.08 | 0.865 | 0.9 | 0.8 | 83.8 | 6.70 | 1.68 | 2.99 |
FIG. 15c

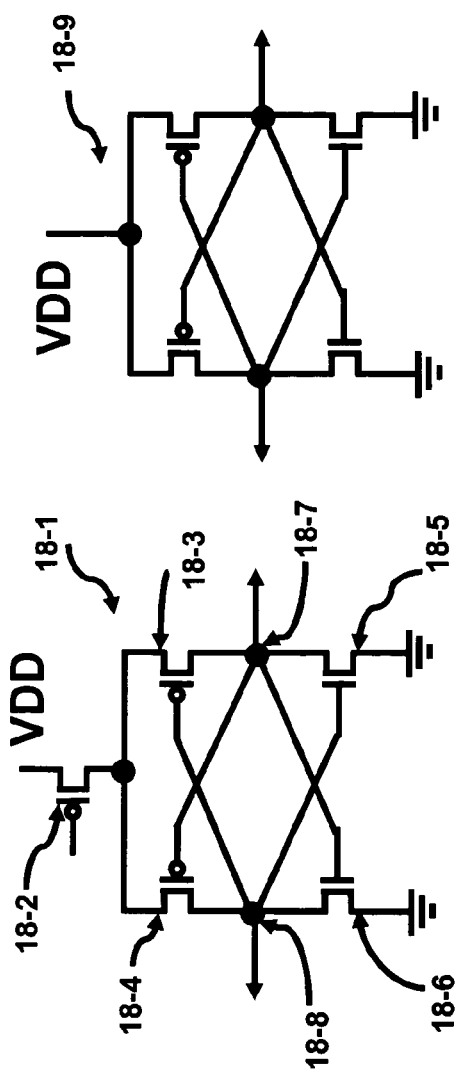
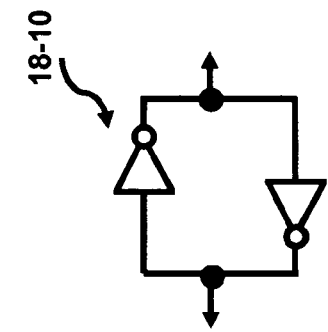
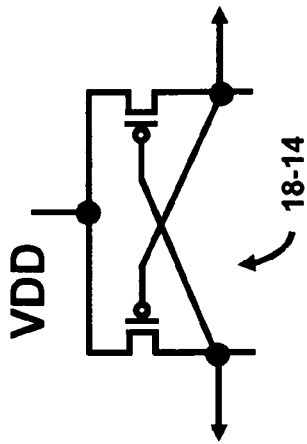
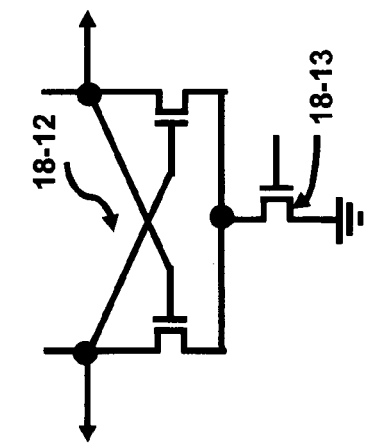
FIG. 18a
FIG. 18b
FIG. 18c
FIG. 18d
FIG. 18e
FIG. 18f

| Type | Conventional LC tank | Two-coil TC tank | Three-coil TC tank | Four-coil TC tank |
|---|---|---|---|---|
| $W_p/W_n$ | 200μm/100μm | 80μm/40μm | 50μm/25μm | 40μm/20μm |
| C | 0.5pF | 1.6pF | 1.9pF | 2.0pF |
| Power | 21mW | 10.7mW | 7.2mW | 5.8mW |
| L | 0.8nH | 0.85nH | 0.857nH | 0.865nH |
| R | 3.34Ω | 3.397Ω | 3.405Ω | 3.407Ω |
| $R_{equ}$ | 6.68Ω | 3.397Ω | 2.403Ω | 1.903Ω |

FIG. 23e

| Frequency | 5 GHz |
|---|---|
| Process | 0.18μm |
| VDD | 1.8V |
| $R_{sheet}$ | 0.08Ω/□ |
| $V_{swing}$ | 0.1 -> 1.6V |

FIG. 23f

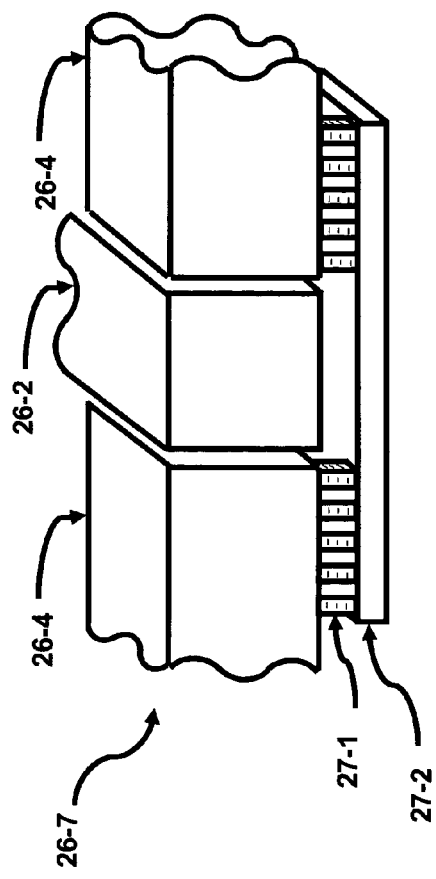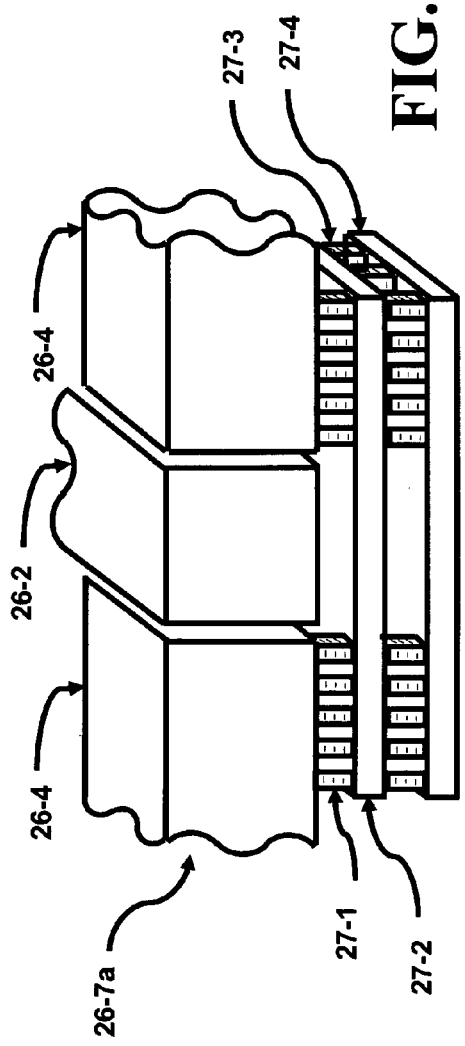

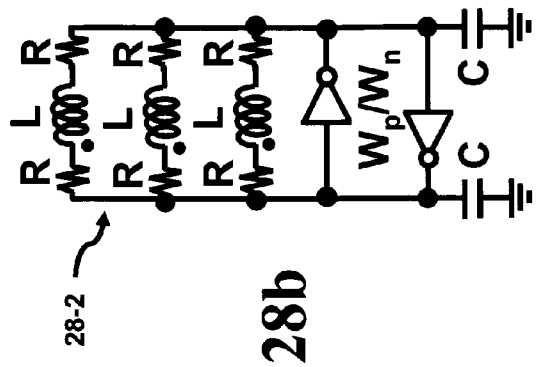
FIG. 28b
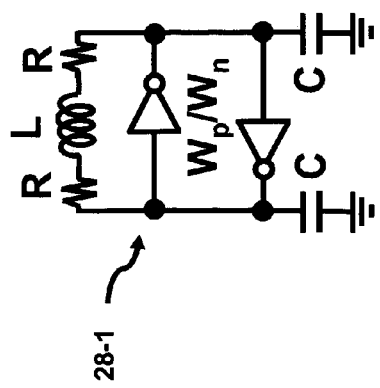
FIG. 28a
| Type | Conventional LC tank | Three-coil TC tank |
|---|---|---|
| $W_p/W_n$ | 40μm/20μm | 10μm/5μm |
| C | 2pF | 2.4pF |
| Power | 5.1mW | 1.6mW |
| L | 0.782nH | 0.782nH |
| R | 0.57Ω | 0.68Ω |
| $R_{tot}$ | 1.14Ω | 0.367Ω |
FIG. 28c
| Frequency | 5 GHz |
|---|---|
| Process | 0.18μm |
| VDD | 1.8V |
| $R_{sheet}$ | 0.01Ω/□ |
| $R_{via}$ | 22Ω |
| $V_{swing}$ | 0.1 -> 1.6V |
FIG. 28d

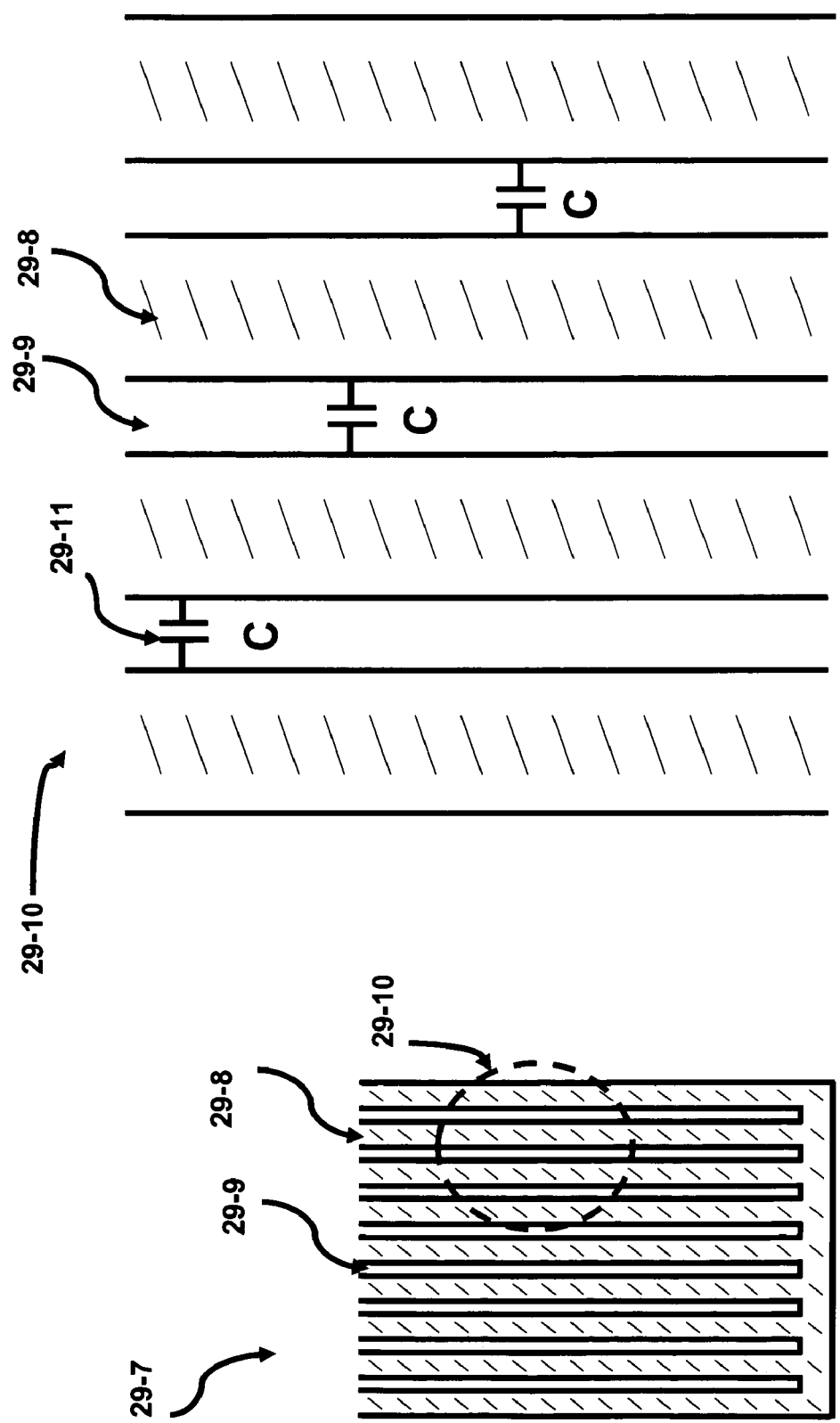

FABRICATION OF INDUCTORS IN TRANSFORMER BASED TANK CIRCUITRY

CROSS-REFERENCE TO RELATED APPLICATIONS

The present application is related to the co-filed U.S. applications Ser. No. 11/184,768, 11/185,001, and 11/184,428 filed on Jul. 19, 2005, which are invented by the same inventor as the present application and incorporated herein by reference in their entireties.

BACKGROUND OF THE INVENTION

Electronic consumer products are pushing both the bounds of portability and computation complexity, in certain cases, simultaneously. Today mobility implies that the product has attributes such as the capability of being wireless. In addition, since video is playing a larger role in our lives every day, the need for low power computation techniques and high performance for video applications for both mobile and desktop systems is required.

An oscillator block provides the ability to regulate the flow of computation data within a VLSI (Very Large Scale Integration). For instance, the on chip clock frequency of a high-end microprocessor is expected to reach 10 GHz before the end of this decade. In addition, the power dissipation for the microprocessor is expected to be about 200 W, where the clock network will consume almost half of this power or 100 W. Thus, for this microprocessor, the higher frequencies and larger power dissipation values indicate a need to have clock circuits that can easily generate a 10 GHz signal and should be able to reduce the power dissipation of the clock network. The clock network of these VLSI chips typically contains large values of capacitance that need to be driven.

Handheld units are driving the desire for the ubiquitous need for wireless. Due to the limited energy storage ability of batteries, energy conservation is paramount for longer play and talk times. These units contain a mixture of analog and digital components. Analog circuits are used in the radio frequency (RF) sections of the wireless blocks that typically contain some form of a clock oscillator. The digital circuits will require a lower power technique of distributing the clock signal within the chip. By minimizing the power dissipation of the clock circuits and networks of the wireless units, the time between charging the batteries of the portable units can be extended.

Some of the basic circuit blocks to help achieve the ability for mobility, low power, and high computation require the necessity of a clock oscillator block. Tank circuits have been used to generate oscillatory clock signals. These circuits use LC (inductor-capacitor) elements to form the tank circuit.

For example, U.S. Pat. No. 5,396,195 issued Mar. 7, 1995 to Gabara depicts a basic LC tank circuit in an MOS technology. Several examples are given where a cross-coupled MOS circuit drives the tank circuit. The oscillations generated by the MOS LC tank circuit fabricated in a 0.9 µm CMOS technology operated with a supply voltage of 3.3V. The power dissipation was reduced by a factor of a 10× when a capacitive load was driven using an LC tank circuit as compared to being driven using conventional digital techniques. This circuit has been used in a multitude of applications ranging from wireless to on-chip clock generation modules. Many of the inductors used in this type of tank circuit have the form of the horizontal planar inductor as illustrated in FIG. 1a and FIG. 1b. These type of inductors typically require a large amount of area to form the inductor.

The calculations of the values of these type of inductors is provided in a published paper, "Simple Accurate Expressions for Planar Spiral Inductances", IEEE J. Solid-State Circuits, Vol. 34, No. 10, October 1999, by Mohan et al., hereafter referred to as the "Mohan" reference.

In addition, the Q or quality factor of these inductors that are fabricated in CMOS are typically low. The quality factor or Q is a primary parameter in the evaluation of tank circuits.

$$Q = 2\pi \frac{\text{Maximum energy stored in tank circuit}}{\text{Energy dissipated per cycle}} \quad (1)$$

The Q indicates the amount of energy dissipated by the tank circuit to maintain oscillations. The tank circuit is more energy efficient as the value of the Q term increases which indicates that the energy dissipated in the tank circuit decreases. One way to decrease the dissipation is to reduce the parasitic resistance of the inductor.

Another method to increase the Q for designs above 1 GHz is to reduce the induced eddy current in the conductor of the inductor. As pointed out by Niknejad and Meyer, IEEE Trans. Microwave Theory Tech., Vol. 49, No. 1, January 2001, the eddy current loss within the metallic region of the planar inductors is a dominant loss above 1 GHz.

U.S. Pat. No. 6,759,937 issued Jul. 6, 2004 to Kyriazidou suggests a balanced vertical multi-layer planar inductor to reduce the area and improve the symmetry of the inductor. A vertical planar inductor is very similar to a helix. This helix uses a square coil instead of a circular one. A square helix structure is illustrated in FIG. 1c. This structure offered the benefit of using less real estate and higher Q for a given value of inductance. Kyriazidou achieves this in part by decreasing the resistance of the coil. Their approach is to shunt sections of a lower metal layer winding to sections of a higher metal layer winding by using multiple vias.

U.S. Pat. No. 5,831,331 issued Nov. 3, 1998 to Lee proposed a helix structure to form a vertical multi-layer planar inductor that uses shielding to increase the inductance. A shield formed in the substrate stops the flow of eddy currents in the substrate. This structure also offered the benefit of using less area for a given value of inductance. In addition, Lee desired to decrease the resistance of a coil in a lower metal layer by electrically connecting the lower layer coil to an upper layer coil formed in a higher metal layer. There is a drawback to this reduction of the resistance. As described by Lee, a single via is used to create this electrical connection. Because only one end of the upper layer coil is DC connected to the lower coil (by this single via), the desire to reduce the resistance of the lower coil in not effective since current entering the higher metal level would not have a return path back to the lower coil. This is in stark contrast to the approach of Kyriazidou since Kyriazidou does provide multiple current return paths from sections of the upper metal layer to sections of the lower layer and achieves the goal of reducing the resistance of the coil. Thus, Lee's approach to reducing the resistance of a coil does not achieve its goal.

U.S. Pat. No. 6,480,086 issued Nov. 12, 2002 to Kluge et. al., describes a vertical multi-layer planar inductor to increase the inductance for a given area usage. Kluge uses a helix to create the inductance. In addition, a transformer is described where the second coil is closely spaced to the first coil to achieve a magnetic coupling between the two coils. Kluge indicates the use of multiple vias to reduce the series resistance. However, this resistance reduction is directed to the via connection itself.

Because real estate is expensive, reducing the area used to from the inductors would be beneficial. In addition, it is desirable to address power dissipation reduction issues in the design of inductors. The first is to decrease the parasitic resistance of a coil so that losses are minimized. Next, it is desirable to decrease the eddy current loss within the metallic inductor. Doing so offers an increase in the Q of the tank circuit and provides the added benefit of reducing the power dissipation of the tank circuit. This application will address these and other issues necessary to help achieve these goals.

BRIEF SUMMARY OF THE INVENTION

Inductors are used in a variety of circuits. In the manufacture of the inductor, there is a parasitic resistive element contained within the inductor. This parasitic element causes losses in the circuit. The goal is to reduce the value of this parasitic resistance as much as possible in order to minimize the energy loss as indicated by the previous references. This procedure effectively lowers the sheet resistance since the overall metal sheet resistance decreases. However, it would be desirable to decrease the parasitic resistance, decrease the flow of eddy current within the metallic conductor of the inductor, and adjust the mutual coupling between two parallel-connected inductors thereby controlling the value of the overall effective inductance.

The basic invention is to place additional inductors in parallel across the two leads of an existing inductor that forms an LC tank circuit. It is important to note the parallel connection implies a true parallel connection; the added inductor has two leads (or the two access points of the inductor) and these two leads are placed in electrical contact (in parallel) with the two leads of the existing inductor that forms the inductance in the LC tank circuit. Connecting these two inductors together leads to a reduction of the overall parasitic resistance. This reduction in resistance occurs since the parasitic resistors are all connected in parallel. It is well known that by paralleling resistors, their net resistance decreases. However, besides reducing the resistance, the inductance also decreases according to the parallel rule applied to inductors. Thus, both the resistance and inductance are reduced using the parallel combination technique. In other words, connecting two identical inductors in parallel creates a single effective inductor that has half the parasitic resistance and half of the initial inductance value of either inductor. In some cases, this may be acceptable for certain applications.

Another aspect of this invention is to reduce the parasitic resistance of a parallel combination of inductors, yet prevent the full effect of the parallel reduction rule to reduce the overall inductance value. The key aspect of this invention is to utilize the magnetic coupling between the two inductors to compensate for this inductance reduction. The structure to obtain this behavior is known as the transformer. In order for this idea to function, the transformer is connected in a particular configuration that allows the reduction of the parasitic resistance but attempts to maintain the value of the inductance at its original value. In its simplest form, the transformer consists of two identical inductors that have a mutual coupling coefficient k. This value can be adjusted within the range of 0 to that approaching 1. Lenz's law is utilized to increase the overall inductance by using the magnetic coupling between the two coils to effectively increase the inductance of coils that are mutually coupled together. Thus, when two identical inductors in the transformer are connected in parallel and the mutual coupling coefficient k is close to 1, the parasitic resistance decreases in half, but the final inductance value is nearly equal to the initial inductance value of either inductor. A further benefit of this technique in a planar technology is that an inductor can be segmented into parallel strips along its length according to this invention and thereby reducing the eddy current loss within the inductor. By maintaining the coefficient k large between these parallel strips, the initial value of the inductor can be maintained while simultaneously achieving a decrease in eddy current loss.

BRIEF DESCRIPTION OF THE SEVERAL VIEWS OF THE DRAWINGS

FIG. 1*a-b* illustrates two planar inductor structures.

FIG. 1*c* presents a view of a planar inductor that has a helix structure.

FIG. 2 through 3 shows an RLC circuit, a physical representation and a table giving capacitance values for several frequencies.

FIG. 4*a* is an RLC circuit using two non-coupling inductors in accordance with the present invention.

FIG. 4*b-c* illustrates a physical representation and a table giving capacitance values for several frequencies.

FIG. 5*a* depicts an RLC circuit using two parallel coupling inductors in accordance with the present invention.

FIG. 5*b-c* depicts a physical representation of the circuit and a table giving capacitance values for several frequencies.

FIG. 8*a* is an RLC circuit using two parallel coupling inductors in accordance with the present invention.

FIG. 8*b-c* provides a physical representation of the circuit and a table giving capacitance values for several frequencies.

FIG. 15*a-b* provides circuit equivalent models for parallel-connected inductors with parasitic resistances that are also magnetically coupled.

FIG. 15*c* provides a table of estimated parameters of several transformer-based inductors following the embodiment of this invention.

FIG. 18a-f shows several examples of a regenerative circuit.

FIG. 23e provides the simulation results of the circuits presented in FIG. 23a-d.

FIG. 23f depicts the simulation conditions of the simulation results given in FIG. 23e.

FIG. 25a illustrates the inventive description of a two-metal layer transformer connected as an inductor with parallel coupling.

FIG. 25b illustrates the circuit schematic of FIG. 25a.

FIG. 27a depicts an inventive cross-under for the inductor of FIG. 26.

FIG. 27b provides a second form of an inventive cross-under for the inductor of FIG. 26.

FIG. 28a illustrates a conventional LC tank circuit.

FIG. 28b depicts the inventive circuit in a three-coil configuration where the inductor of FIG. 26 is used.

FIG. 28c provides the simulation results of the two circuits of FIG. 28a-b.

FIG. 28d shows the simulation conditions applied to the circuits of FIG. 28a-b.

FIG. 29b provides a magnified view of the planar inductor in FIG. 29a assuming the inductor is formed using parallel coils is in accordance with the present invention.

FIG. 29c illustrates a magnified view of the inset shown in FIG. 29b indicating the capacitances between coils in accordance with the present invention.

DETAILED DESCRIPTION OF THE INVENTION

Figures 1D, 1E:
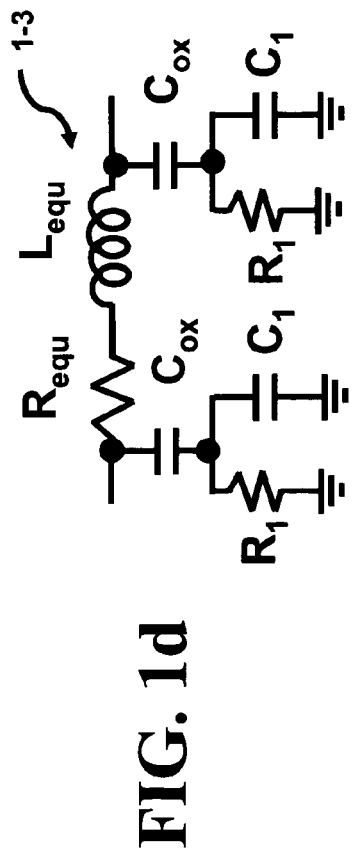
FIG. 1*d* depicts an equivalent circuit for the planar inductor shown in FIG. 1*a-b*.
FIG. 1*e* provides dimensions and parameters for several inductors.

The LC (inductor-capacitor) tank circuit has been a fundamental building block in many electrical system designs. This circuit is used in the wireless, digital, and mixed-signal designs. The basic building elements of the LC tank circuit consist of an inductor and capacitor.

The invention is based on the discovery that a transformer can be used to decrease the effective resistance of an equivalent inductance that is applied to a capacitive load while maintaining a higher inductance value. The coupling coefficient of the transformer can be utilized to increase the effective inductance presented to the capacitor yet significantly reduce the resistance of the equivalent inductance of the transformer. The ability to reduce the resistance will offer an improvement in the Q or quality factor of the inductor.

In addition, this technique offers a degree of freedom in the design of tank circuits, which did not exist previously. For example, tradeoffs between single and multi-coil tank circuits can be compared. The number of coils in a multi-coil transformer may be optimized for a particular use. The power dissipation of several tank circuits using an equivalent inductance based on a single or multi-coil transformer can be compared. Finally, the coupling of the transformer can be utilized to injection lock all the tank circuits formed on the chip.

Several basic examples of an LC tank circuit in different configurations will be described and this analysis will be used to set a reference point so that a better comprehension of the invention can be made. Since the inventive tank circuit uses a transformer instead of an inductor, these circuits are called TC (transformer-capacitor) tank circuits.

Several assumptions are initially made to simplify the analysis of the inventive entity. This helps identify the key aspects of the invention without losing insight. It would be very informative to see what capacitive loads allow the inventive circuit to operate under three different frequencies: 1 GHz, 5 GHz and 10 GHz. To help achieve this analysis, the following assumptions will be made.

The first one will be to assume that the resistive component of the tank circuits will not significantly affect the frequency of operation of the TC tank circuits. Thus, instead of providing an actual resistance value, a relative value of resistance will be given and this value will be scaled appropriately for each different circuit analyzed. Later, the impact of incorporating a realistic value of resistance into the circuit will be described. In particular, the simulation results will include the resistive losses of the tank circuit. This realistic value will dissipate the energy in the tank circuit thereby requiring an additional circuit which has the ability to regenerate the energy loss in the resistive losses of the tank circuit. Various versions of this regenerative circuit will be described.

The second one will assume that the value of the inductor L (if the circuit only contains one inductor) or $L_{equ}$ (determining an equivalent inductance if several inductors are used in the circuit) will be targeted to remain constant. Initially, this inductance value will be temporally be set to 0.8 nH unless otherwise specified.

The third one will assume that the self-inductances of the coils in the transformer are equal.

The last one will assume that the capacitive load elements in a balanced tank circuit are equal. To be more specific, if a tank circuit generates a clock and a clock bar signal, the capacitive load attached to both of these nodes are identical.

It is important to understand that setting these assumptions does not limit the range or scope of the inventive idea. The above assumptions help as an aid to easily identify the keys aspects of the invention. Before a TC tank circuit is utilized in an actual operating system, each of the above assumptions will need to be re-evaluated according to the specifications of the design parameters. Those skilled in the art will recognize that the above assumptions do not limit the scope of the invention.

FIG. 1a illustrates a square inductor 1-1 with one turn. Note that this inductor has at least two leads, 1-4 and 1-5, or ways of physically connecting the inductor to a circuit. The width of the metallic trace is shown as W. A two-turn inductor 1-2 is depicted in FIG. 1b. The measurements of the outside diameter is shown as $d_{out}$, while the inside diameter is listed as $d_{in}$. In addition, the distance between traces is identified as S. These types of inductors can occur in an IC (Integrated Circuit), a VLSI chip, an RF (Radio Frequency) chip, a PWB (Printed Wire Board), a MEMS (Micro-Electro-Mechanical-System) die or a MCM (Multi-Chip Module). The equivalent circuit representation 1-3 of the coils 1-1 and 1-2 are provided in FIG. 1d. A simplified version of this equivalent circuit of an inductor will be utilized in many of the circuits analyzed in this paper to help provided the essential idea of this invention.

FIG. 1c depicts a helix structure used to form an inductor 1-3. This inductor has two leads 1-6 and 1-7. A single turn coil 1-12 is formed in a lower metal layer, then a via 1-8 is used to connect this coil to the single turn coil 1-11 in an upper metal layer. The via 1-9 connects the middle coil to the top coil 1-10 formed in an upper metal layer The inductors 1-1, 1-2 and 1-3 are typical for the type of inductors found in a planar technology layout. These inductors are also called coils where coil can indicate that the conductor forming the inductor has a configuration that spans a portion of 360 degrees.

In all of these planar inductors presented, several aspects were not shown. The substrate of the integrated circuit upon which these planar inductors are fabricated is not shown. In addition, the oxide or dielectric layer surrounding the metal layers is not illustrated. This provides an easier description of the structure of the inductor. The integrated circuit can typically have a plurality of metallization and dielectric layers. In addition, only a square inductor has been shown, however, those skilled in the art will realize that the inductor can be formed in a circular, oval, hexagonal shape or other shape, and still be within the scope of the invention.

Finally, the table listed in FIG. 1e displays the parameters of several inductors that were designed using the "Mohan" reference. The first column lists the values of the self-inductances L as 0.8, 1.6, 0.85, 0.857 and 0.865 nH. The inductors are designed with 2, 4, 2.06, 2.07 and 2.08 turns as indicated in the second column. The need for the atypical values of 2.06, 2.07 and 2.08 turns will become apparent later. They all have the same outside dimension as indicated by $D_{out}$. The remaining dimensions of $d_{in}$, W, and S are also indicated. The number of squares forming the conductive trace of each inductor is indicated in the seventh column. The last column provides the parasitic resistor ratio where the parasitic resistance of the inductor with a self-inductance of 0.8 nH is used as the reference. All of these inductors were designed to occupy the same area where each inductor occupies an area of 200 by 200 μm. These inductors will be used in several different tank circuits to help identify the invention.

The number of squares can be used with the sheet resistance value to determine an approximate resistance. The skin effect typically increases the resistance of the inductors proportional to the square root of frequency; however, the skin resistance effect will not be addressed in this discussion so that the concepts of the invention can be more easily visualized. For instance, the skin-depth in copper is about 0.66 μm at 10 GHz. Because of this effect, the current is carried near the surface causing the resistance to increase as mentioned earlier.

The schematic of a simple series RLC (resistor-inductor-capacitor) circuit 2-1 is illustrated in FIG. 2a, while a physical model 2-2 of the same circuit is provided in FIG. 2b. The actual physical model may contain the planar inductors described earlier or consist of physical discrete parts. The physical models presented in the next several figures are of a simplified representation and are useful to understand the structure of the tank circuits with regard to current flows and physical placement of the basic RLC components. The capacitor C is formed using a lower conducting plate 2-3 and upper conducting plate 2-4 separated by the distance d and can have a dielectric in between the plates. A metallic wire 2-5 connects the upper plate to the lower plate (although the latter physical connection is blocked from view). Note that the capacitor has two leads as indicated at the locations where the wire connects to the plates. The wire 2-5 represents the inductor L which has a self inductance of 0.8 nH. The entire circuit contains resistance. The wire forming the inductance has a resistance value and is sometimes called a lossy inductor. The capacitor plates add another resistance loss as well. In addition, the contacts of the wire to the capacitor plates add more resistance.

On a first order, most of the resistance is typically contained in the inductor L and the thrust of this description will be to reduce this component of resistance. This assumption will be applied to many of the figures in this specification and this resistance will be called $R_{equ}$. However, those skilled in the art will appreciate that a more accurate representation of the total resistance in the tank circuit will include the combined resistance values of all of these circuit elements.

Assume the top plate is charged to +V volts, a current flow of I is provided in the wire 2-5. This circuit will oscillate at different frequencies depending on the values of the inductor L and capacitor C. FIG. 2c provides an approximate frequency, since the $R_{equ}$ was not included, of operation according to the following formula where only the values of C and L are used:

$$f = \frac{1}{2\pi\sqrt{LC}} \quad (2)$$

Note that the fifth column indicates the ratio of $R_{equ}/R_{ref}$. $R_{ref}$ was selected to be equivalent to the parasitic resistance of the 0.8 nH inductor designed in FIG. 1e. Note that the value of $R_{ref}$ is set equal to R and in the case of the planar inductor corresponds to the resistance of 82□'s of metal.

Figures 3A, 3B, 3C:
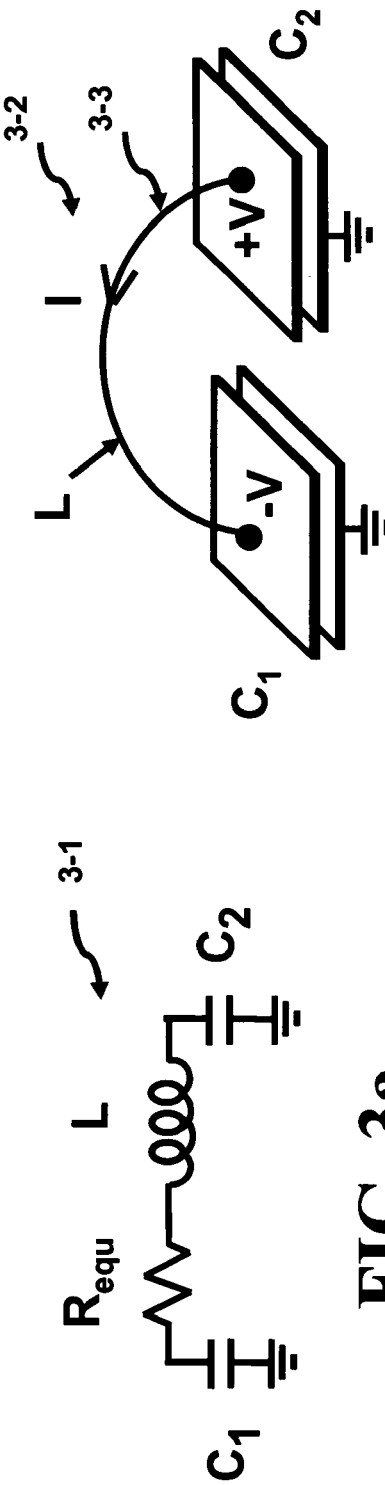

FIG. 3a shows the schematic of a Colpitts oscillator 3-1 consisting of one inductor L with a value of 0.8 nH, one resistor and two capacitors $C_1$ and $C_2$. A physical representation of the Colpitts oscillator 3-2 is illustrated in FIG. 3b. Each capacitor is formed using a set of parallel plates. The inductance L is formed using a wire 3-3. The initial voltages of −V and +V volts are applied to the top plate of each capacitor as illustrated. Values for the circuit elements are given in FIG. 3c. The values of $C_1$ and $C_2$ are summed together to provide the total value of capacitance $C_{tot}$ across which an oscillatory signal is generated. The values of $C_{tot}$ in FIG. 3c indicate that the Colpitts oscillator can oscillate 4 times more capacitance when compared to the simple series RLC tank circuit 2-1 given in FIG. 2, yet both circuits still generate the same frequency. This occurs because the two capacitors $C_1$ and $C_2$ are connected in series (through the common ground) and have an equivalent capacitance of $C_{equ}$ determined by combining these two capacitors using the series rule of combining capacitors in equation (3) where n corresponds to the number of parallel capacitors.

$$\frac{1}{C_1} + \ldots + \frac{1}{C_n} = \frac{1}{C_{equ}} \qquad (3)$$

Note that $C_{equ}$ given in FIG. 3c is equal to C given in FIG. 2 and these two circuits become equivalent after the series rule for the combination of capacitors is applied to the circuit of FIG. 3. Thus, after the series capacitors in the Colpitts oscillator are simplified to the equivalent capacitance, both circuits are identical. Thus, $C_1$ and $C_2$ can be series combined using equation (3) and form an equivalent circuit representation as indicated in FIG. 2.

This demonstrates the benefit of a Colpitts circuit where oscillatory signals are generated in a balanced fashion. The Colpitts oscillator can drive or generate an oscillation signal across more total capacitance $C_{tot}$ for the same given frequency and in addition, the Colpitts oscillator also generates a clock signal on the top plate of both capacitors of FIG. 3b that are 180 degrees out of phase with each other. Since the same inductance value was used, the ratio $(R_{equ}/R_{ref})$ for the Colpitts oscillator is equal to one.

FIG. 4a depicts the schematic of a dual parallel inductor oscillator 4-1. It consists of two inductors $L_1$ and $L_2$, two resistors $R_1$ and $R_2$, and one capacitor $C_{tot}$. Note that the value of the resistances $R_1$ and $R_2$ increased by 37%. These inductors of 1.6 nH have a longer metal trace as indicated in FIG. 1d. This longer trace also caused the resistance $R_{equ}$ to increase.

$$\frac{1}{L_1} + \ldots + \frac{1}{L_n} = \frac{1}{L_{equ}} \qquad (4)$$

By using equation (4) (where n corresponds to the number of parallel inductors) to combine parallel inductors, the equivalent parallel inductance $L_{equ}$ presented to the circuit reduces to the value of 0.8 nH as required by our earlier assumptions.

$$\frac{1}{R_1} + \ldots + \frac{1}{R_n} = \frac{1}{R_{equ}} \qquad (5)$$

Equation (5) determines the equivalent resistance of n resistor in parallel. FIG. 4 has two resistors in parallel, and the equivalent resistance is found using equation (5) and is indicated in FIG. 4c. Note that the equivalent resistance is only 0.69 R. This is an unobvious advantage of combining lossy inductors together. That is—combining parallel lossy inductors reduces the resistance of the overall inductance network yet still provides the value of the desired inductance value. To our knowledge, this simple technique of reducing the resistance by utilizing parallel combination techniques to inductors has not been incorporated in the design of LC tank circuits. Shortly, an enhancement to this inventive technique will be described.

A physical representation of the dual parallel inductor oscillator 4-2 is illustrated in FIG. 4b and specifies the placement of the two inductors $L_1$ 4-4 and $L_2$ 4-3 in conjunction with the parallel plate capacitor $C_{tot}$. This circuit has a ratio $(R_{equ}/R_{ref})$ of 0.69, which indicates that the dual parallel inductor oscillator can decrease the equivalent resistance $R_{equ}$ of the circuit.

According to M. E. Van Valkenburg, Network Analysis, Third Edition, 1974, Prentice-Hall, Inc., Englewoods Cliffs, N.J., page 38: "When the magnetic field produced by a changing current in one oil induces a voltage in other coils, the coils are said to be coupled, and the windings constitute a transformer."

There are two basis mechanisms to specify the amount of coupling and direction of the coupling in a transformer. The amount of coupling known as the coupling coefficient, k, determines the level of mutual inductance interaction of the transformer. The value of k can range from 0 (no coupling) to 1 (100% coupling). The k value indicates how much flux from the first coil is linked to the second coil. In addition to the k factor, the coils of the transformer are marked to indicate the direction of this linking or coupling. That is as current enters the first node of the first coil, a voltage is generated on one of the nodes of the second coil. These two nodes are then marked. Depending on the value of k and the positioning of the two dots, the mutual inductance of the transformer can be adjusted significantly. The term coil and inductor are used interchangeably. Inductors have a self-inductance while two inductors that are magnetically (mutually) coupled form a transformer. These inductors that are mutually coupled are referred to as coils of the transformer.

For a transformer with two coils (a transformer can have more than two coils), the two dots can be orientated in four different ways. FIG. 5a shows the dots configured as Top-Top (T-T). The other three possibilities are T-B, B-T and B-B, where B stands for Bottom. The configuration of T-T has a similar behavior to the B-B configuration and will be called parallel coupling, while B-T and T-B configurations have a similar behavior and will be called anti-parallel coupling. Thus, only the T-T (FIG. 5) and T-B (FIG. 7) will be discussed.

FIG. 5a shows a schematic of a transformer-capacitor (TC) based tank circuit 5-1 where two parallel inductors $L_1$ and $L_2$ are connected in parallel to the capacitor $C_{tot}$. The two inductors also have has a series resistor $R_1$ and $R_2$, respectively. This tank circuit has a T-T coupling configuration. A physical depiction of this circuit is provided in FIG. 5b. Note that the inductors $L_1$ and $L_2$ are formed from two wires which each connect the top plate of the capacitor to the lower plate of the capacitor, furthermore, these two wires are closely positioned to each other. Since the current flow in both wires is in the same direction, the transformer behaves as a T-T coupling configuration. In FIG. 5a, the current flow in one coil of a T-T configuration would present more inductance to the second coil according to Lenz's law. As current flows in the first coil, it will retard current flow in the second coil. Likewise, the current flow in the second coil will retard the current flow in the first coil. Thus, a T-T configuration will tend to increase the equivalent inductance in the circuit. In addition, the coupling coefficient k indicated the strength of this interaction. The closer the wires are together, the greater the coupling coefficient. In FIG. 5b, the wires forming the inductances $L_1$ and $L_2$ are placed adjacent to one another, thus the coupling coefficient k would be large; assume it is 0.9. Because of the T-T configuration and k being large, the mutual inductance the transformer presented to the capacitor $C_{tot}$ is large; the equivalent inductance $L_{equ}$ presented to the capacitor $C_{tot}$ is almost equal to the self-inductance of either coil or 1.58 nH. Again, because the larger inductance value was used, the corresponding resistance of each inductor has a value that is 37% greater. However, the parallel combination of these two resistor gives an equivalent resistance of $R_{equ}$=0.69 R and is an improvement over using a single inductor as described earlier.

Because the equivalent inductance $L_{equ}$ of the transformer in FIG. 5a works out to be 1.58 nH, the desired goal of achieving 0.8 nH was overshot due to the mutual inductance of the transformer causing the inductive value to increase. This implies that the initial value of the each self-inductance in the transformer can be adjusted to compensate for the effect of the mutual inductance. However, this time the coupling coefficient k is used to determine the starting value of each inductor $L_1$ and $L_2$ to insure that the final parallel combination of the $L_{equ}$ solves to 0.8 nH. If k is assumed to be 0.9, the inductor values are estimated to be 0.85 nH each. Doing so and using k=0.9, provides a final equivalent inductance $L_{equ}$ of 0.8 nH.

Figures 6A, 6B, 6C:
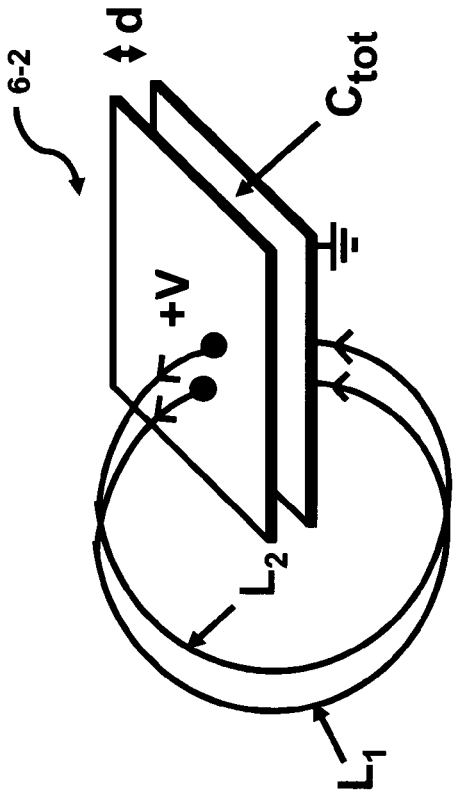
FIG. 6*a* depicts an RLC circuit using two parallel coupling inductors in accordance with the present invention.
FIG. 6*b-c* depicts a physical representation of the circuit and a table giving capacitance values for several frequencies.

This is illustrated in FIG. 6, which duplicates the circuit of FIG. 5 with the exception that the value of the self-inductance of the inductors $L_1$ and $L_2$ are set to 0.85 nH. If these two parallel inductors are simplified to their equivalent inductance using the coupling coefficient k and the T-T coupling configuration, the equivalent inductance is 0.8 nH as indicated in FIG. 6c. This is spectacular because the resistance of the two 0.85 nH inductors comprising the transformer is only 1.017 R. After determining the equivalent resistance $R_{equ}$ of these two parallel-connected resistors $R_1$ and $R_2$, the value of $R_{equ}$ is found to be 0.51 R. The ratio $R_{equ}/R_{ref}$ is 0.51. Thus, the transformer tank circuit with a T-T coupling coefficient and a k value of 0.9 reduces the resistance down to 50% of the Colpitts oscillator given in FIG. 3. This is the key aspect of the invention that maintains a desire value of inductance yet minimizes the final resistance. Thus, this circuit would have a higher Q or quality factor since the resistive loss would decrease.

This idea can be extended to include a transformer having more than two inductors where the equivalent resistance will be the parallel combination of three or more parallel resistors causing the resistance to become further reduced. This is an aspect that all tank circuits seek to achieve since the a higher Q provides many benefits including generating less phase noise, operating with better frequency selection, and having less power loss to name a few characteristics.

Figures 7A, 7B, 7C:
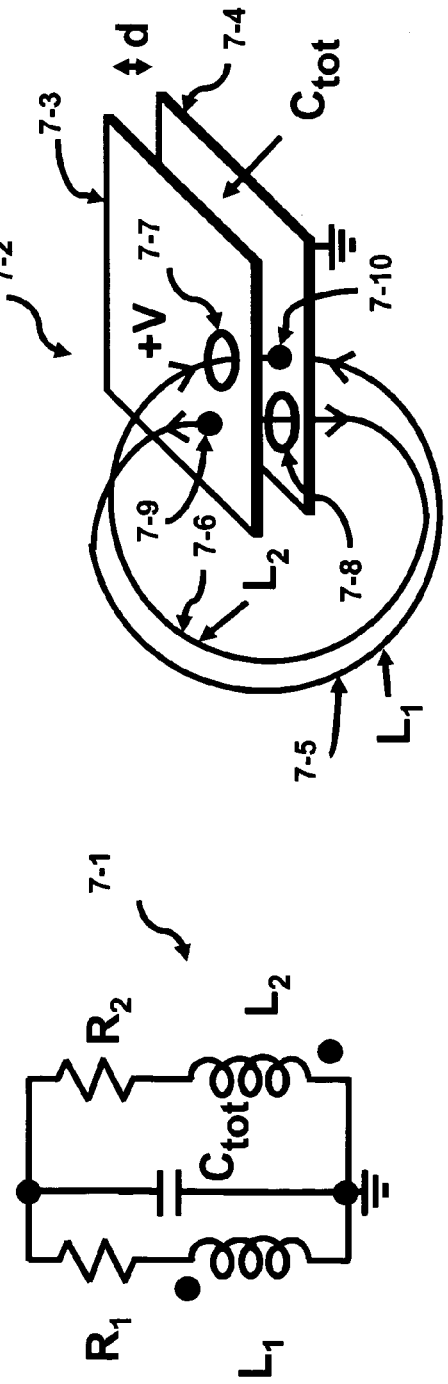
FIG. 7*a* is an RLC circuit using two anti-parallel coupling inductors in accordance with the present invention.
FIG. 7*b-c* gives a physical representation of the circuit and a table giving capacitance values for several frequencies.

In FIG. 7a, the schematic of a circuit 7-1 using the T-B anti-parallel coupling configuration is illustrated. Here the current flow in one coil would enhance the flow of current in the second coil; likewise, the current flow in the second coil would also enhance the current flow in the first coil. Thus, the T-B configuration reduces the equivalent inductance being presented to the capacitor $C_{tot}$ depending on the value of the coupling coefficient k.

FIG. 7b illustrates the physical structure 7-2 of the circuit in FIG. 7a. The upper conducting plate 7-3 and the lower conducting plate 7-4 which are separated by the distance d forms the capacitor $C_{tot}$. A metallic wire 7-5 makes a connection 7-9 to the upper plate 7-3 and loops around both plates to make a connection 710 to the lower plate 7-4. In addition, a second wire 7-6 connects to the top plate 7-3 and loops downward through the hole 7-8 in the bottom plate 7-4 and then loops around both plates passing through the hole 7-7 in the upper plate 7-3 that then makes a connection 7-10 to the lower plate 7-4. The wire 7-5 is the coil forming the inductance $L_1$, while the wire 7-6 is the coil forming the inductance $L_2$. Because these two coils are placed close together, the coupling coefficient k should be large. The lower plate 7-4 is connected to ground.

FIG. 7c provides capacitance value and the frequency of operation of the circuit. Note that the equivalent inductance that the transformer presents to the capacitor $C_{tot}$ is very low—only 0.04 nH when k is assumed to be 0.9. This illustrates the case where the equivalent inductance $L_{equ}$ can be significantly reduced. This type of circuit can be used to reduce the inductive voltage drop of a varying current, since the voltage drop will be proportional to the inductance.

The TC tank circuit can be arranged to have a Colpitts configuration as indicated by the circuit schematic 8-1 given in FIG. 8a. This transformer uses a T-T coupling configuration. The corresponding physical structure 8-2 is indicated in FIG. 8b. The two capacitors $C_1$ and $C_2$ are formed using parallel plate conductors. The top plate of the first capacitor is connected to the top plate of the second capacitor using two wires that are also the elements of the coils of the transformer. As indicated in FIG. 8c, the $L_{equ}$ is 0.8 nH. Also, the equivalent resistance $R_{equ}$ is approximately 50% of the initial circuit which did not incorporate the mutual inductance effect. Finally, note that the circuit in FIG. 8 can drive into oscillation 4 times more capacitance than the circuit illustrates in FIG. 6.

The coupling coefficient can be utilized in the design of tank circuits to affect the value of inductance that is presented to the capacitive component of a tank circuit. This ability can be used for a multitude of uses in the analog and digital field; such as, wireless applications, clocking networks, driving mixers, adiabatic logic, to name a few.

Figure 9:
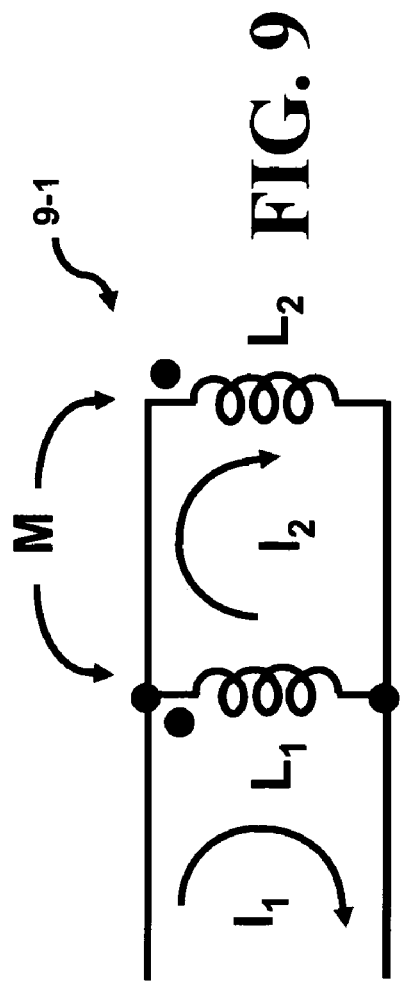
FIG. 9 provides the mesh current analysis circuit for two inductors in parallel.

FIG. 9 is used to determine the effective inductance of the parallel combination of $L_1$ and $L_2$ that are magnetically coupled. Note that the two coils are in a parallel coupling configuration. The mutual inductance is given as:

$$M = k\sqrt{L_1 L_2} \tag{6}$$

Using mesh equations, the equivalent inductance ($L_{equ}$) of the coupled coils 9-1 of FIG. 9 is:

$$Z_{input} = \frac{\Delta_z}{\Delta_{11}} \tag{7}$$

$$= j\omega L_{equ}$$

$$= j\omega \frac{\begin{vmatrix} L_1 & -L_1 + M \\ -L_1 + M & L_1 + L_2 - 2M \end{vmatrix}}{L_1 + L_2 - 2M}$$

$$= j\omega L_1 - j\omega \frac{(-L_1 + M)^2}{L_1 + L_2 - 2M}$$

Assume that $L_1 = L_2 = L$ and using equation (6) gives;

$$L_{equ} = \frac{L}{2}(1 + k) \tag{8}$$

If the transformer had the two coils in an anti-parallel coupling configuration, the + sign in equation (8) would be changed to a − sign.

Figure 10:
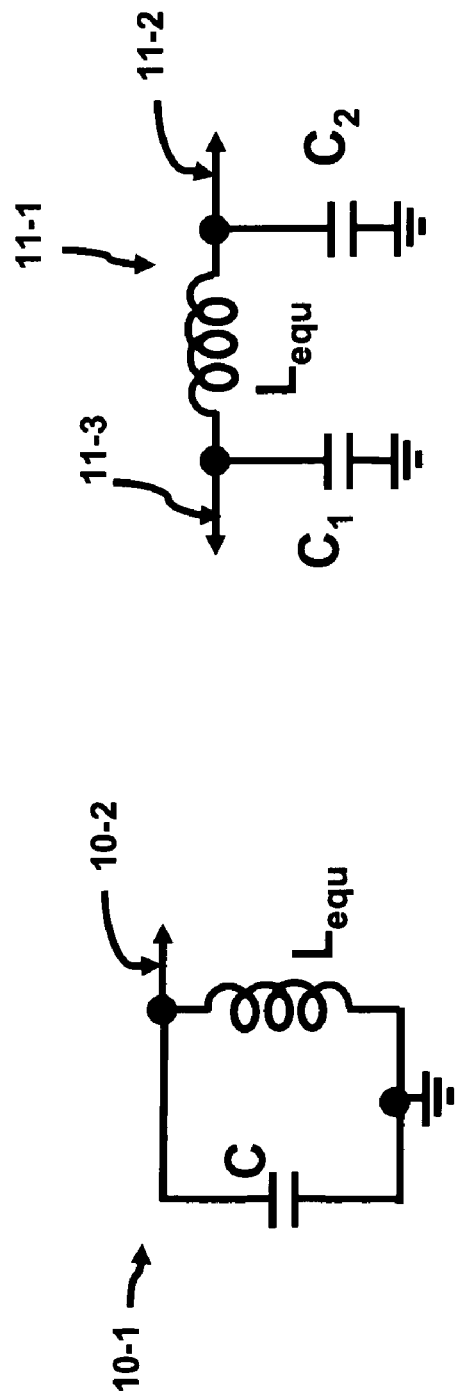
FIG. 10 shows an equivalent inductance $L_{equ}$ in a parallel LC tank circuit.

Placing a capacitor across the equivalent inductance $L_{equ}$ forms the tank circuit 10-1 given in FIG. 10. One end of the capacitor is grounded and a single output is generated at 10-2.

Figure 11:
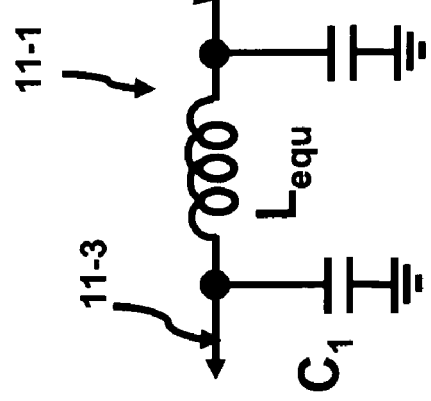
FIG. 11 shows the equivalent inductance in a Colpitts circuit.

A Colpitts oscillator 11-1 is illustrated in FIG. 11. Two capacitors $C_1$ and $C_2$ are placed at each end of the equivalent inductance $L_{equ}$ providing two outputs 11-2 and 11-3 which generate oscillations that are 180 degrees out of phase with each other. The capacitors $C_1$ and $C_2$ in FIG. 11 are both twice the value of the single capacitor C in FIG. 10 and both circuits will operate at the same frequency.

Figure 12:
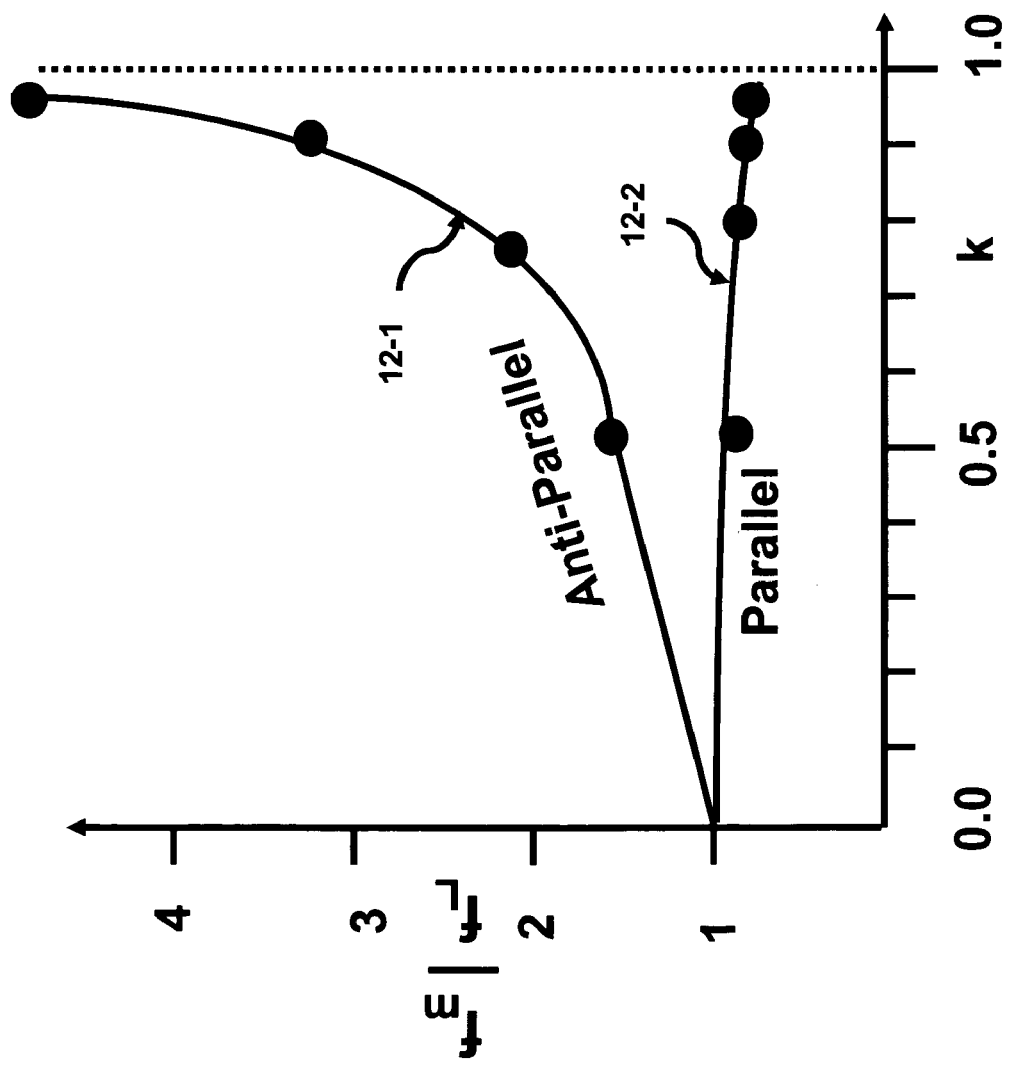
FIG. 12 depicts the graph of the frequency ratio as a function of k that the inventive TC tank circuit can oscillate compared to a conventional LC tank circuit.

The ratio of the frequency of a TC tank circuit $f_{TC}$ compared to the frequency of a LC tank circuit $f_{LC}$ is illustrated in FIG. 12. These TC tank circuits contain two self-inductances. Equation 2 and equation 8 are used to determine the ratio of the frequencies of these two different types of tank circuits. The final simplified relationship is given as follows:

$$\frac{f_{TC}}{f_{LC}} = \frac{1}{\sqrt{1 \pm k}} \quad (9)$$

The relationship given in equation (9) is plotted in FIG. 12. The k value has either a + or − term to account whether the circuit is a parallel or anti-parallel configuration, respectively. Note when k=0, the ratio equals one as expected. The anti-parallel coupling configuration occurs when the denominator is (1−k). This corresponds to the top curve 12-1. The frequency of the TC tank circuit increases and approaches infinity as k−>1.

The lower curve 12-2 corresponds to the case when the denominator is (1+k), this is the parallel coupling configuration and indicates that the effective inductance of the tank circuit increases and lowers the frequency of operation of the TC tank circuit as compared to the LC tank circuit.

Figure 13:
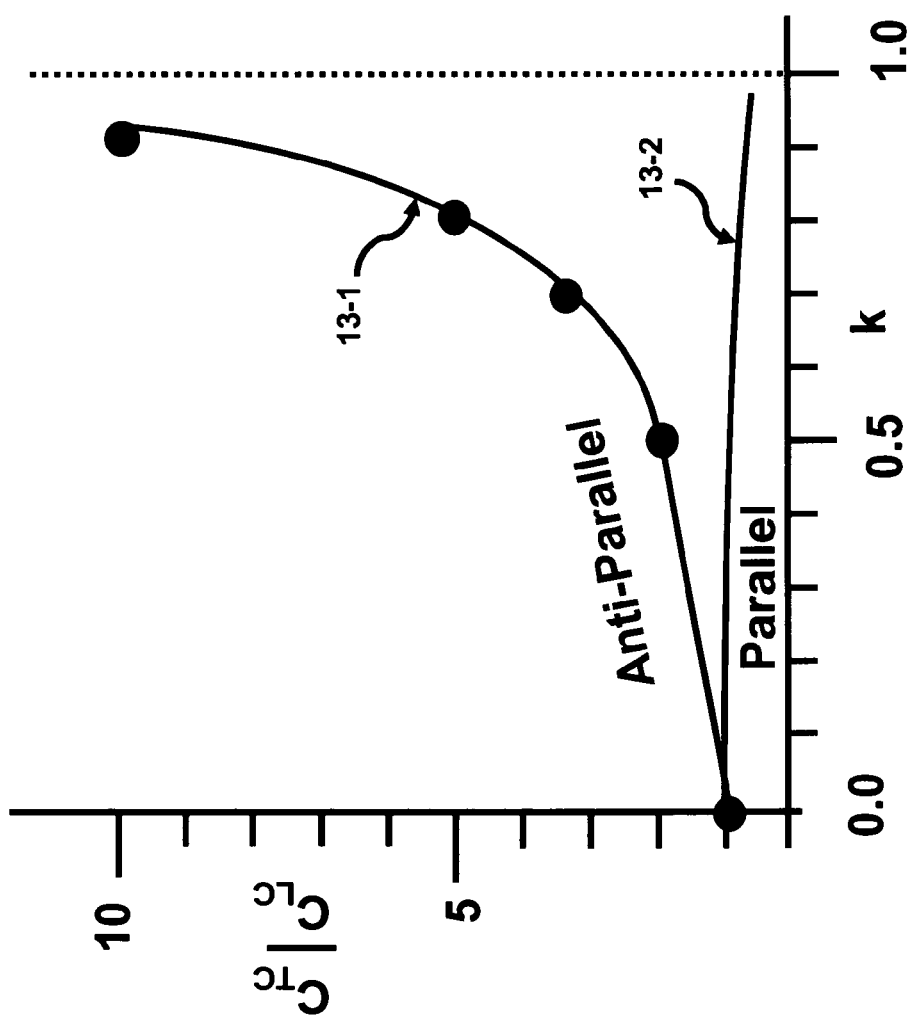
FIG. 13 depicts the graph of the capacitance ratio as a function of k that the inventive TC tank circuit can oscillate compared to a conventional LC tank circuit.

The next relationship given in equation (10) is plotted in FIG. 13. For a given k value, this graph compares the amount of capacitance $C_{TC}$ in a TC tank circuit to the amount of capacitance $C_{LC}$ in a LC tank circuit that can be placed into oscillation as a function of the coupling coefficient.

$$\frac{C_{TC}}{C_{LC}} = \frac{1}{1 \pm k} \quad (10)$$

The anti-parallel coupling configuration occurs when the denominator is (1−k), as the coupling coefficient k increases, the amount of capacitance 13-1 that the TC tank circuit can oscillate increases. This occurs because the equivalent inductance of the TC tank circuit decreases.

The lower curve 13-2 corresponds to the case when the denominator is (1+k), the amount of capacitance that the circuit can oscillate decreases at a slow rate as the function k−>1.

The mesh equation analysis for all the schematics given in FIG. 14 were performed similar to the analysis determined in FIG. 9. Besides having a series resistance, each coil has a mutual inductance term M with every other coil in the circuit. The analysis given is for the case where coils of the circuit all are arranged in a parallel coupling fashion. That is, all the coils are configured in an arrangement of T-T-....-T. Assume that all self-inductances; $L_1=L_2 \ldots =L$, that all resistances; $R_1=R_2 \ldots =R$, and all mutual inductances; $M_1, M_2 \ldots =M$.

This assumption simplifies the equation and provides an insight into finding an approximate value for the equivalent inductance. Accepting the previous assumptions and conditions, the equivalent impedance $Z_2$ for a two-coil transformer for the circuit using the current mesh analysis depicted in FIG. 14a is:

$$Z_2 = R_{equ} + j\omega L_{equ} = \frac{R}{2} + j\omega \frac{L}{2}(1+k) \quad (11)$$

Figure 14B:
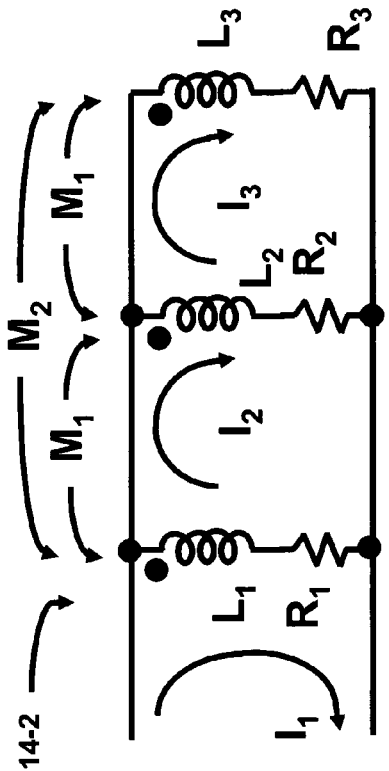
FIG. 14*a-c* depicts the circuits for the mesh current analysis of several parallel inductors each inductor having a series resistor.
Figure 14A:
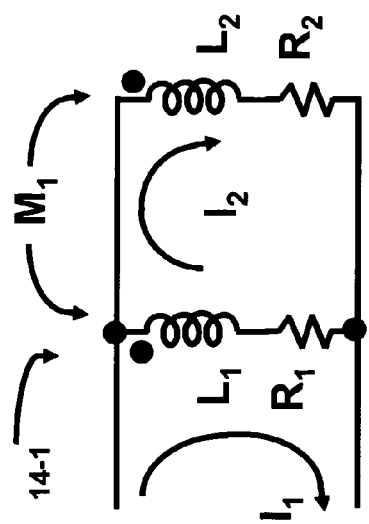

FIG. 14b shows a parallel connection of three mutually coupled coils. The equivalent impedance $Z_3$ for this three-coil transformer is:

$$Z_3 = R_{equ} + j\omega L_{equ} = \frac{R}{3} + j\omega \frac{L}{3}(1+2k) \quad (12)$$

Figure 14C:
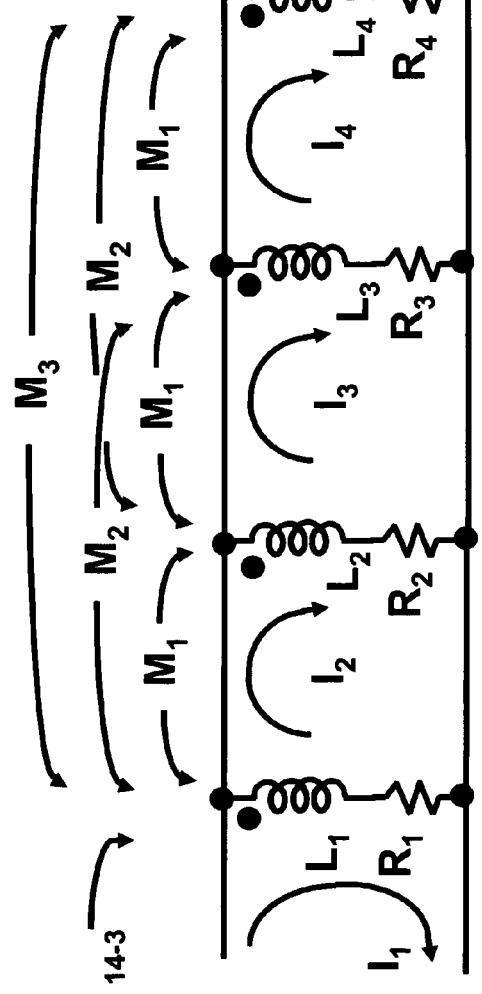

FIG. 14c shows a parallel connection of four mutually coupled coils. The equivalent impedance $Z_4$ for this four-coil transformer is:

$$Z_4 = R_{equ} + j\omega L_{equ} = \frac{R}{4} + j\omega \frac{L}{4}(1+3k) \quad (13)$$

Note two conditions in equations 11 through 13; if k is close to 1, the equivalent inductance $L_{equ}$ is approximate to the value of the self-inductance L of a single coil. Secondly, the resistance of the multi-coil transformer decreases proportionally to the number of coils. Thus, this type of transformer provides an inductance that remains constant but decreases in resistance as the number of coils are increased as indicated by the resistive component $R_{equ}$ of equation (11) through equation (13). This will provide a mechanism to improve the Q or quality factor of an inductor in circuits where a high Q is desired. In addition, the power dissipation of the circuit will be decreased.

FIG. 15a depicts this impedance in a Colpitts oscillator 15-1 configuration including the equivalent resistance $R_{equ}$. The total resistance in a tank circuit consists of several resistance terms. Because of this resistive loss, the oscillations generated by the tank circuit 15-1 would eventually die out. Thus, a regenerative circuit is required to replace the energy lost by the dissipative process of energy flow through the resistive components. The regenerative circuit can be formed out of active devices; such as MOS transistors, CMOS transistors or BJT transistors. The regenerative circuit provides a negative resistance that cancels the parasitic resistance in the tank circuit. FIG. 15b combines the equivalent resistance $R_{equ}$ and the equivalent inductance $L_{equ}$ into an inductor symbol 15-2 with two dots called $L_{TC}$. The two dots indicate whether the transformer has a parallel or anti-parallel configuration. The symbol 15-2 is a parallel-configured transformer.

FIG. 15c provides the parameters of a coil and several transformers that can be formed in a planar technology. The single coil is listed in the first row where T=1. This coil has two turns and is the same coil described the first row of FIG. 1e. The self-inductance L is 0.8 nH and the metallic trace has 82□'s of resistance. Since this is only a single coil, the values of $L_{equ}$ and $R_{equ}$ have the same values as before, respectively. Assuming a sheet resistance of 0.08Ω/□, the resistance of this single coil is 6.56Ω. The resistance of $R_{coil}$ and $R_{equ}$ are equivalent since there is only one coil. The Q of this coil is 0.765.

The second row of FIG. 15c gives the parameters for a transformer with two coils since T=2. The coupling configuration of this and the remaining coils all has a parallel coupling configuration as in this case indicated by the T-T. This transformer, as well as, the remaining transformers is formed using the single coil listed in the first row with a slight modification. This modification is that the number of turns has been increased to 2.06. For the transformer with T=2, the N has been increased to 2.06. This modification increases the self-inductance of the coil to 83.4 nH. Referring to FIG. 1e, note that the outer dimension of this coil remains at the value of $D_{out}$=200 µm, Thus, the area of this transformer is the same as that of the single coil. The coupling coefficient k is 0.9. Using equation (11), the $L_{equ}$ is found to be 0.8 nH. The value of the resistance $R_{equ}$ for this transformer is given as 3.34Ω. This lower value for resistance occurs because each coil has a resistance of 6.67Ω due to the turns ration of 2.06. Since the two coils are in parallel, the equivalent resistance $R_{equ}$ is the parallel combination of the two resistances or 3.34Ω. The Q for this transformer is 1.5.

The third and fourth rows indicate the parameters of a 3 and 4 coil transformer. The turns ratio of the coils forming the transformer is 2.07 and 2.08, respectively. In both transformers, the self-inductance L has been designed at 0.857 and 0.865 nH, respectively. Using equation (12) and equation (13), respectively, the equivalent inductances $L_{equ}$ of these two transformers are found to be 0.8 nH. Similarly, the resistance for the three coil transformer (T=3) $R_{equ}$ is 2.22Ω. In the case of the T=4 coils transformer, the resistance $R_{equ}$ is only 1.68Ω. This is over a 4× reduction over that of a single coil. Note that the Q has been increased to almost 3.

This is the key aspect of this invention—paralleling multi-coils in a parallel coupling configuration allows an equivalent inductance $L_{equ}$ of a single coil to be achieved with a reduced equivalent resistance $R_{equ}$ proportional to the number of coils used in the transformer. Furthermore, the area of all of these transformers can be contained within the original area of a single coil. The capacitor loads C1 and C2 can consist of all the parasitic capacitance in the entire circuit. In addition, this capacitor can contain the load capacitance and the adjustable capacitor.

Figure 16:
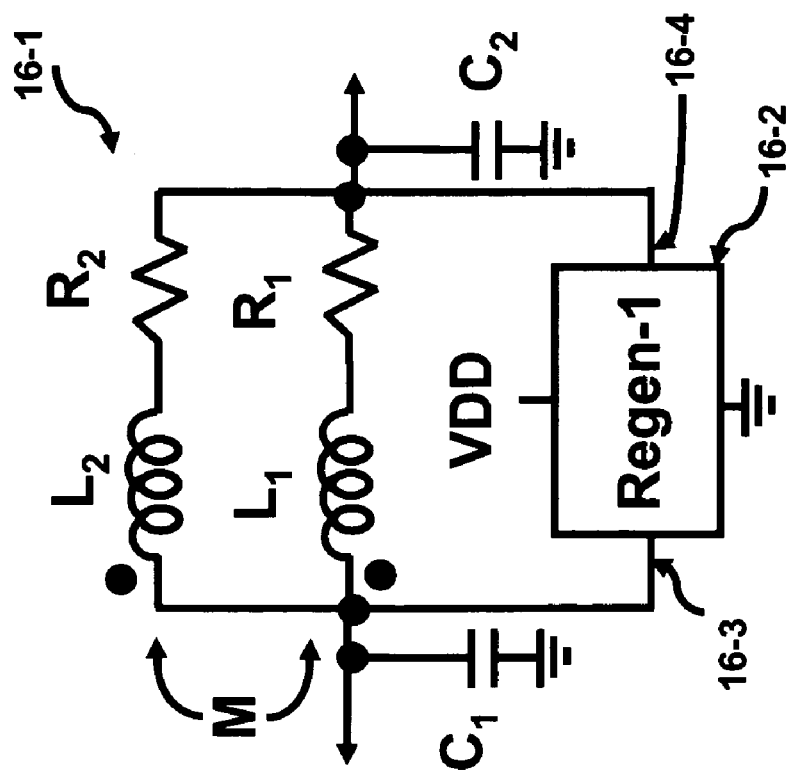
FIG. 16 shows an example of the inventive technique applied to a transformer-capacitor circuit configured as a Colpitts oscillator and connected to a regenerative circuit.

An example of a Colpitts oscillator 16-1 connected to a regenerative circuit 16-2 is given in FIG. 16. This circuit has two outputs 16-3 and 16-4 that connects to the tank circuit. This regenerative circuit is type regen-1 and in addition has a power and ground connection. The oscillator signal is generated across the two capacitors $C_1$ and $C_2$. The signal that is developed across these two capacitors are 180 degrees out of phase with each other.

Figure 17:
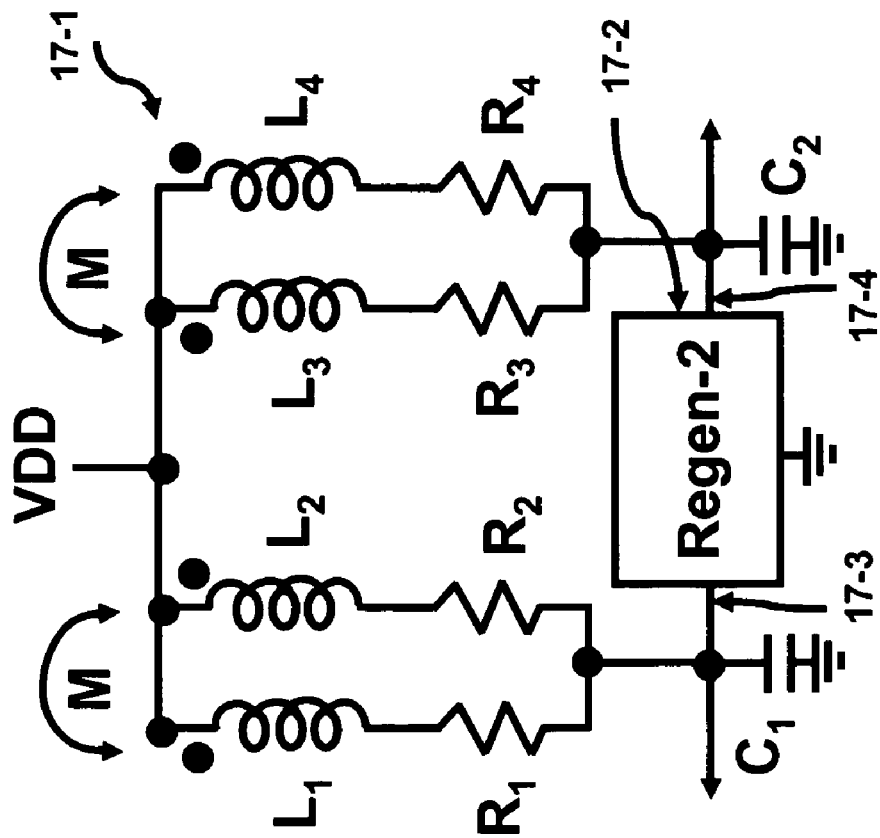
FIG. 17 shows a Hartley oscillator illustrating another inventive aspect connected to a regenerative circuit.

A Hartley oscillator 17-1 is shown in FIG. 17. In total, this circuit requires four inductors. This regenerative circuit 17-2 is type regen-2 and has a ground in this case, but as will be seen shortly may only contain a power connection. The regen-2 has two outputs 17-3 and 17-4 that connect to the tank circuit. Note that both the Colpitts and the Hartley use the parallel coupling configuration. Depending on the need, these oscillators can be configured as anti-parallel coupling configuration as well.

FIG. 18 illustrates several CMOS circuits configured in either regen-1 or regen-2 type regenerative circuits. Similar circuits can be designed using BJT transistors as well. In FIG. 18a, a regen-1 type circuit 18-1 is shown; here a p-channel 18-2 serves as a current source to the rest of the circuit. The two p-channel device 18-3 and 18-4 are cross coupled to each other; that is, the drain of 18-3 is connected to the gate of 18-4 and the drain of 18-4 is connected to the gate of 18-3. This forms a regenerative circuit. A second regenerative circuit consists of the two n-channels 18-5 and 18-6 configured in a similar manner. The negative resistance of this circuit is provided to the TC tank circuit using the two outputs 18-7 and 18-8. The negative resistance of the circuit compensates for the resistive loss of the transformer and allows the oscillation created in the tank circuit to continue.

A regen-1 type circuit 18-9 similar to 18-2 is given in FIG. 18b. The p-channel current source has been removed.

An equivalent representation of the circuit 18-9 is provided in FIG. 18c. This regenerative circuit 18-10 consists of two inverters connected head to tail as shown. This is also the basic building block of a ram-cell that is used to store memory in integrated circuits (IC).

The remaining circuits are regen-2 type. In FIG. 18d, only two cross-coupled n-channel devices form the circuit 18-11 that is used to compensate for the resistive loss of the TC tank circuit. The outputs for this circuit are 18-13 and 18-14. These are the two nodes connected to the TC tank circuit and any external load that is desired to be driven.

The circuit shown in 18-12 of FIG. 18e includes an n-channel current source 18-13. Otherwise it is similar to the circuit of 18-11.

The last circuit 18-14 illustrated in FIG. 18f is the compliment of 18-11, that is all the n-channels are replaced by p-channels and the VSS power supplies (ground) replaced by VDD supplies and vice-versa.

Figure 19A:
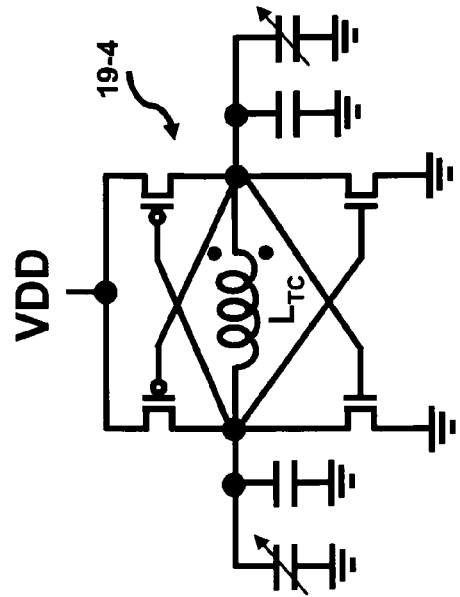
FIG. 19a-c shows circuit schematics where a transformer, capacitors and regenerative circuit are combined together in accordance with the present invention.

FIG. 19 illustrates the TC tank circuit with a regenerative circuit to compensate for all the resistive losses within the tank circuit. In addition an adjustable and capacitive load is shown connected to both outputs of the TC tank circuit. FIG. 19a depicts a current controlled regenerative circuit driving a balanced capacitive load 19-1. A capacitor 19-2 combines all of the capacitance that is typically non-adjustable. This may include the parasitic capacitance of wire interconnections, the capacitance of the gate, drain, overlap capacitance of the transistors forming the regenerative circuit, the capacitance of the inductors 19-4 forming the transformer, and the capacitance of the gates or circuits being driven by the TC tank circuit.

The capacitor 19-3 is an adjustable capacitor which is used to adjust the frequency of oscillation of the TC tank circuit. Some examples include a voltage-controlled varactor that can be formed using a diode or a MOS transistor. The MOS device can be configured as an enhancement or depletion mode device. By adjusting the control voltage to these devices, the capacitance presented to the tank circuit can be modified, thereby, modifying the frequency of operation of the tank circuit. Another form of adjustable capacitor would include an array of MOS transistors. The array would present capacitance to the TC tank circuit through switches that can be controlled by a set of control voltages. By adjusting these voltages, one or many gates can be connected or disconnected to the TC circuit which in turn varies the effective capacitance presented to the TC tank circuit. The frequency of operation of the tank circuit changes according to equation (2). The inductance of the tank circuit 19-4 contains the transformer which has an effective inductance of $L_{equ}$.

Figure 19B:
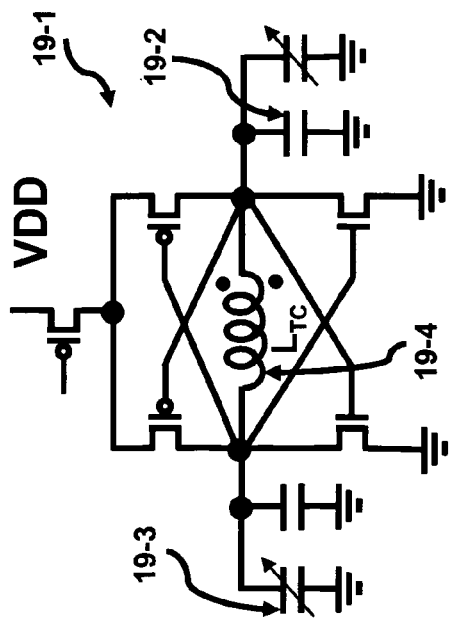

FIG. 19b shows a TC tank circuit 19-4 that is identical to the circuit of 19-1 except the current controlled p-channel transistor is removed. The circuit 19-4 can generate a voltage swing that is larger than the swing produce by the circuit 19-1.

Figure 19C:
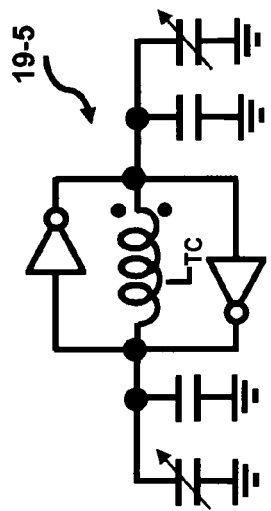

Finally, FIG. 19c presents a TC tank circuit 19-5 that replaces the transistors in the circuit of 19-4 with a ram-cell circuit for a compact representation of a TC tank circuit.

Figure 20A:
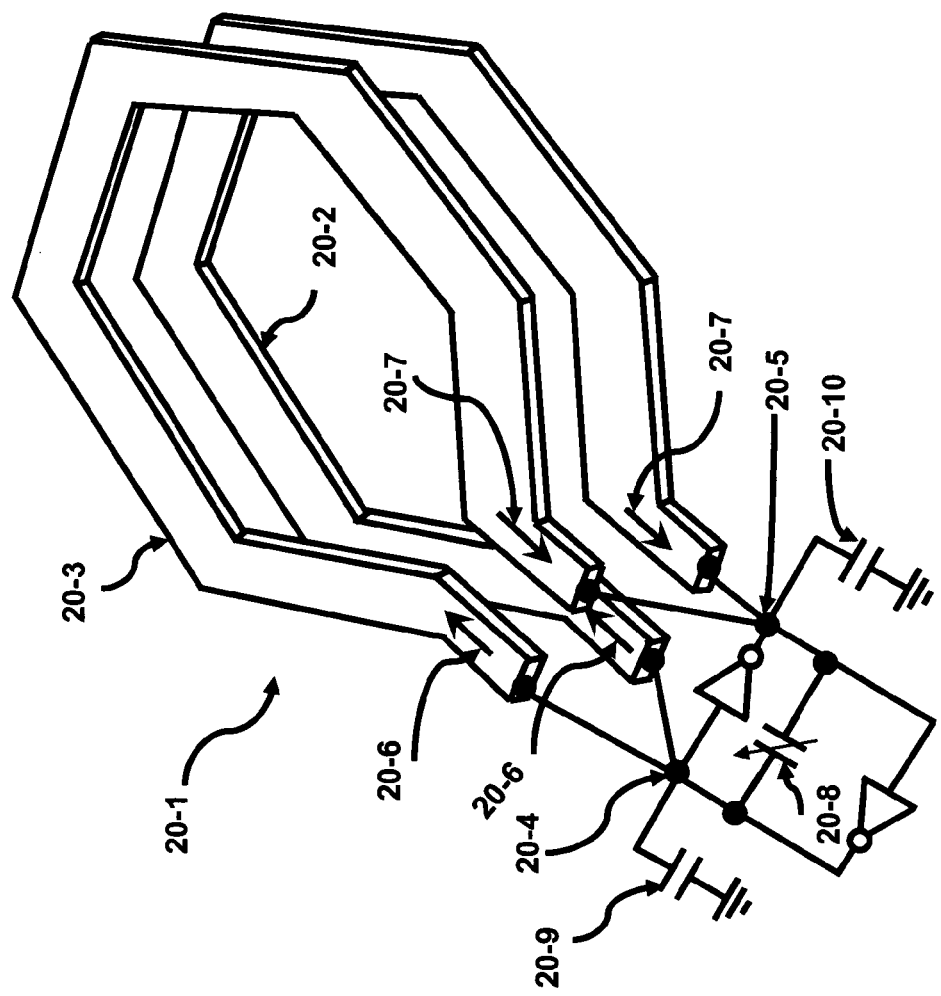
FIG. 20a depicts a physical description of the inventive aspect of the transformer structure in a planar technology connected to a regenerative circuit.
Figure 20B:
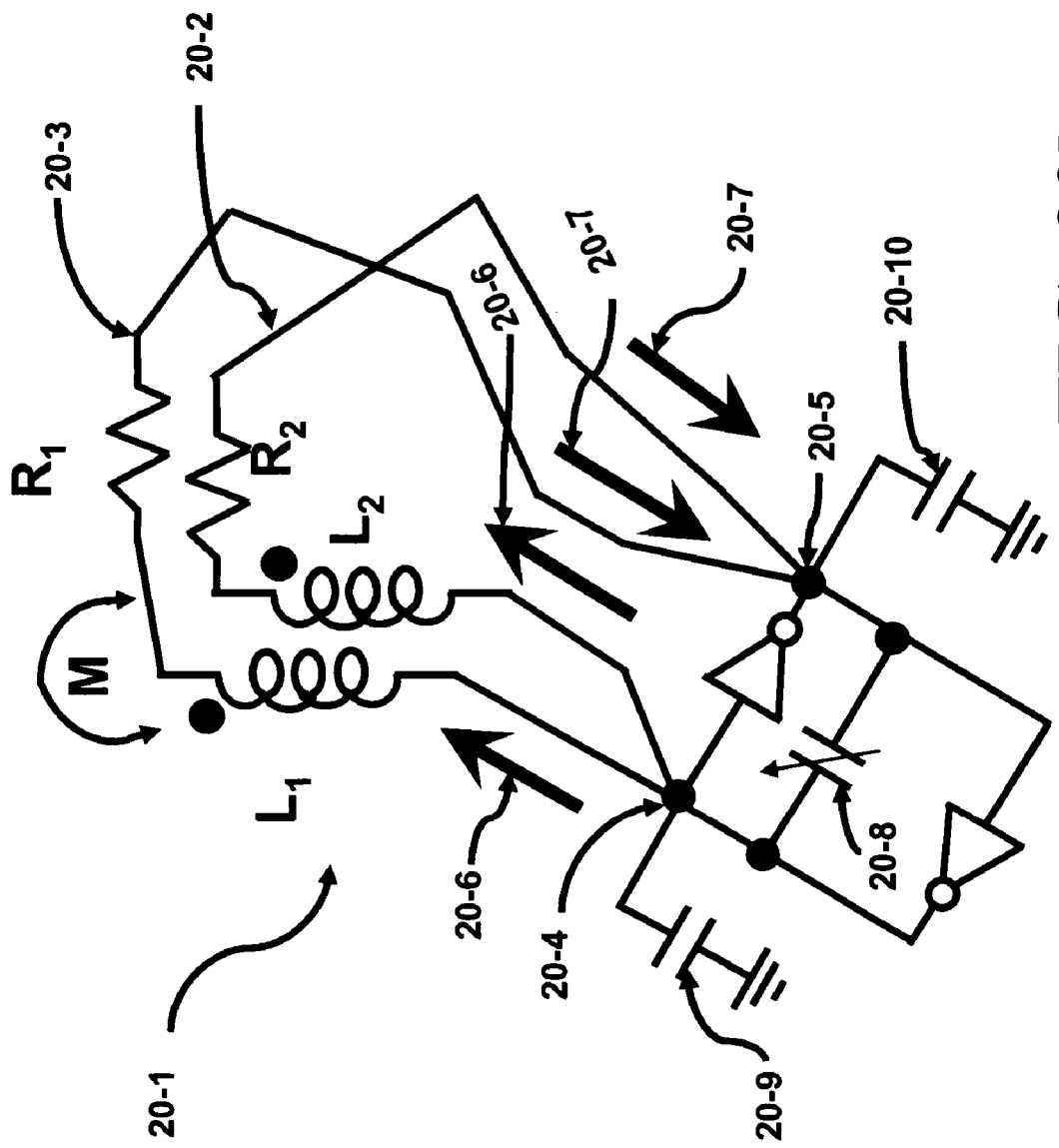
FIG. 20b shows the circuit schematic of the physical transformer structure given in FIG. 20a along with the regenerative circuit.

FIG. 20a and FIG. 20b illustrate a Colpitts oscillator 20-1. In particular, the physical structure of the lower 20-2 and upper 20-3 inductor coils of the transformer are given in FIG. 20a while the corresponding circuit representation of the lower 20-2 and upper 20-3 inductor coils are given in FIG. 20b. The lower and upper coils can be formed in a planar technology. Note that the substrate, vias, and oxide or dielectric layers are not shown with the coils so that the description is simplified. An upper metal layer can be used to fabricate the upper coil, while a lower metal level can be used to fabricate the lower coil. In addition, a dielectric layer would be used to separate the two metals while vias would penetrate the dielectric and form electrical connections to the ends of the two inductors.

Both FIG. 20a and FIG. 20b contain the circuit representation of the regenerative circuit (the two inverters), the adjustable capacitor 20-8 and the non-adjustable capacitor 20-9 and 20-10 loading both sides of the regenerative circuit. Note that the adjustable capacitor is between the two outputs of the tank circuit. This helps to reduce the area required since this single capacitor can occupy an area of ¼ that of two separate adjustable capacitors connected to each output.

In both FIG. 20a and FIG. 20b, one side of the regenerative circuit 20-4 is sourcing current 20-6 into both the upper 20-3 and lower 20-2 inductors. This sourcing current consists of stored charge from load capacitor 20-9, one plate of the adjustable capacitor 20-8 and from the output of the lower inverter. The other side of the regenerative circuit 20-5 sinks the current 20-7 from both the upper 20-3 and lower 20-2 inductors. This current is stored onto the load capacitance 20-10, the second plate of the adjustable capacitor 20-8, and routed by the upper inverter of the regenerative circuit.

FIG. 20a illustrates the physical structure of the transformer. Note that the inductor 20-3 overlays the inductor 20-2. The number of turns N in the coil can be a variable. Such a transformer can be fabricated in integrated circuits (IC) where a lower metal layer can be used to form 20-2 while an upper metal layer can be used to form 20-3. Furthermore, this example shows the case where the coils only have one turn (N=1).

FIG. 20b presents the circuit equivalent of the transformer. The upper 20-3 coil consists of the self-inductance $L_1$ and resistance $R_1$. The lower 20-2 coil is represented by the self-inductance $L_2$ and resistance $R_2$. The coils have a mutual inductance denoted by M. The dots on the transformer indicate that the coils are arranged in a parallel coupling configuration. Thus, the coils are arranged to have an equivalent inductance $L_{equ}$ that attempts to match the value of the self-inductance of either coil as indicated by equation (11) where the + sign is taken. The larger the value of k, the greater will be the match. Furthermore, by observing that the value of the resistance in equation (11) is reduced to half that of a single coil or inductor, making a multi-layer transformer would have the additional benefit of reducing the equivalent resistance. The reduction of the resistance occurs because the coils are connected in parallel.

Figures 21A, 21B:
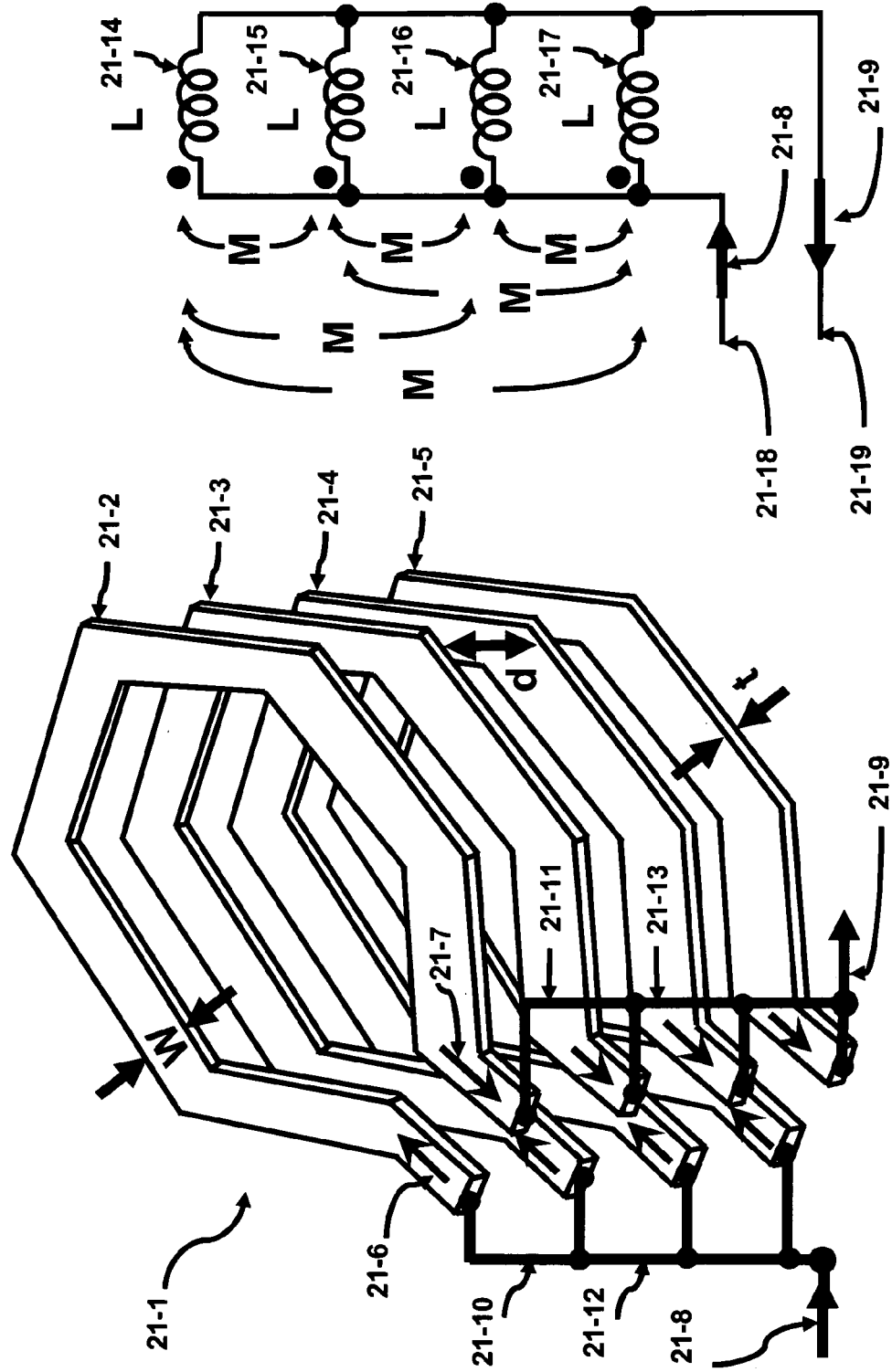
FIG. 21a illustrated the inventive physical structure of a multi-coiled transformer in a planar technology in accordance with the present invention.
FIG. 21b illustrated the circuit schematic of the multi-coiled transformer in a planar technology in accordance with the present invention.

A physical example of a vertical multi-coil transformer 21-1 is illustrated in FIG. 21a. Each inductor is formed in a different metal layer of the planar technology. The illustration indicates a coil with a single turn; however, the coil may contain several turns as well. For a planar technology, these inductor coils have a width W that may be in the 10's of microns wide, the thickness t of the metal layer may be in the range of a micron or so, while the displacement d between metal layers may also be in the range of a micron or so. The overall dimensions of the transformer can be a hundreds of microns by a hundreds of microns. The top most coil 21-2 may be fabricated by using the top metal layers, the coil 21-3 below is fabricated in one of the lower metal layers, similarly, coils 21-4 and 21-5 are fabricated in the lower metal layers. In addition, the coils may be positioned or aligned over one another as shown. Note that the influence of the capacitance between the coils 21-2 and 21-3, 21-3 and 21-4, and 21-4 and 21-5 is minimized since the potentials on these coils are identical to one anther.

The ingress current 21-8 is provided into each of the four inductors as indicated by the arrows 21-6. This is the ingress point of all four inductors. The egress current 21-7 from each inductor coil is collected and sunk as current 21-9. This is the egress point for all four inductors. Note that a symbolic short connects all four-ingress points, in addition, a symbolic short connects all four-egress points. For example, the ingress points of coils 21-2 an 21-3 are connected together by the short 21-10, while the ingress points of 21-3 and 21-4 are connected by the short 21-12. Similarly, the egress points of coils 21-2, 21-3 and 21-4 are connected together by the shorts 21-11 and 21-13, respectively. Vias will be used to replace these shorts 21-10, 21-12, 21-11, and 21-13 in a planar technology as will be shown shortly. Since there are four coils connected in parallel, the equivalent resistance $R_{equ}$, assuming each coil has the same resistance R, would be R divided by the number of coils, or $R_{equ}$=R/4. Thus, multi-coil transformers have the ability to reduce the resistance substantially.

This structure can also be implemented in the MEMS or MCM technology. The MEMS offers the ability to adjust the position of one of the coils which directly adjusts the coupling coefficient k. This feature can be used to adjust the frequency of oscillation of the tank circuit. In a MCM technology, the dimensions and spacing between coils can be increased since another die can be solder bumped to another die. The transformer can be split between these two die. The bump height can be more than a few microns.

So far the use of this transformer has been described in a tank circuit. However, those skilled in the art will recognize that this type of transformer circuit can be utilized in other circuit structures outside the domain of tank circuits. For example, this structure can be used wherever inductors are used in circuit and system designs. The use of this technique has a broad range in circuit applications, such as, filters, power supplies, RF circuits, mixers, etc.

FIG. 21b provides the schematic representation of the physical multi-coil transformer provided in FIG. 21a. Assume all coils have the same inductance L. The schematic shows the transformer consisting of four inductors 21-14, 21-15, 21-16 and 21-17. These inductors represent the coils 21-2, 21-3, 21-3 and 21-4, respectively. Note from the mutual coupling dots that this arrangement is in a T-T-T-T (parallel coupling) arrangement. Thus, the mutual magnetic coupling will tend to maximize the amount of equivalent inductance that this circuit presents at its terminals 21-18 and 21-19.

Figure 22:
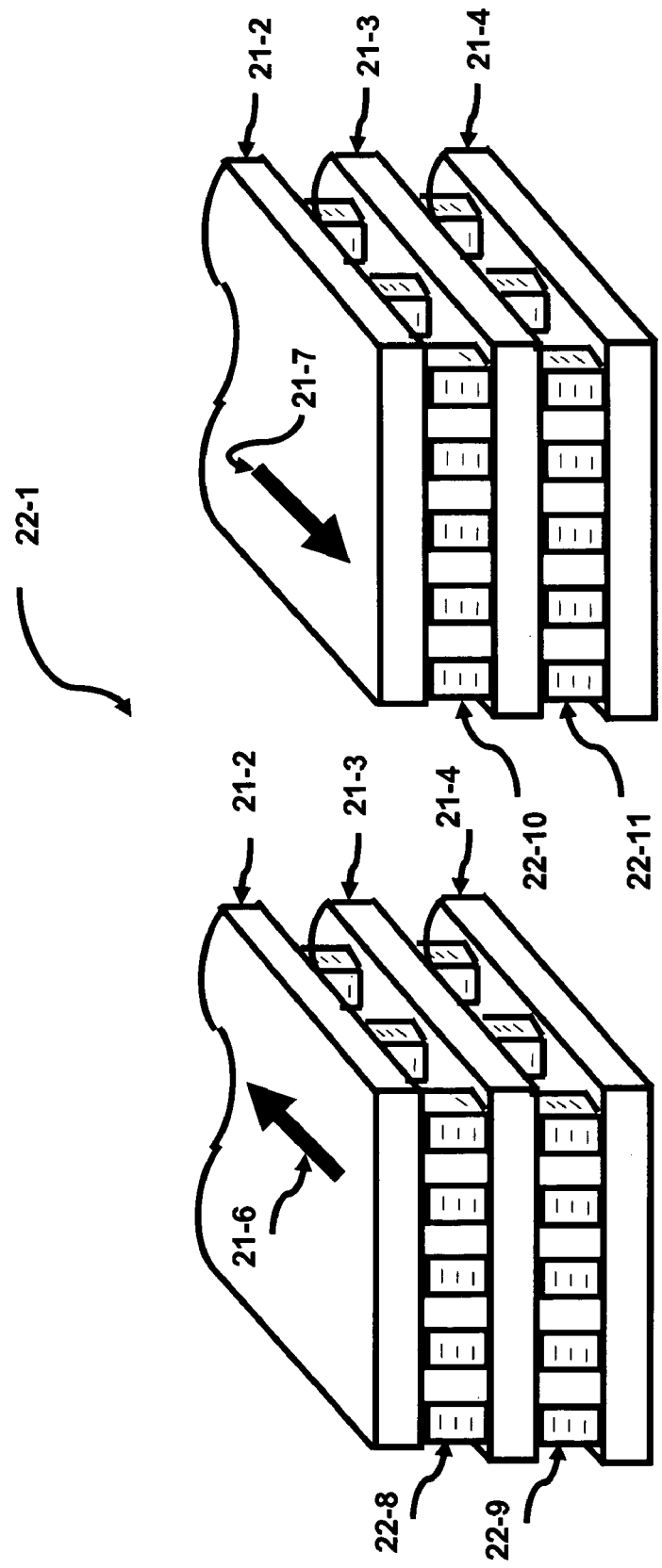
FIG. 22 illustrates the electrical connection between the terminals of the transformer with the use of multiple vias in accordance with the present invention.

FIG. 22 illustrates the physical connection 22-1 showing how the ingress and egress points of the top three inductors; 21-2, 21-3 and 21-4 of FIG. 21 are connected together. The arrow 21-6 in FIG. 22 is the ingress current provided into the top coil on the left side of the inductors of FIG. 21. The ingress point of the top two coils 21-2 and 21-3 are connected together by collection of metallic vias 22-8 which corresponds to the short 21-10 in FIG. 21. These vias are used in the technology to interconnect two metal layers. In addition the third coil 21-4 is connected to the second coil 21-3 using the vias 22-9 which correspond to the short 21-12 in FIG. 21. The arrow 21-7 corresponds to the egress current from the top coil on the right side of the inductors of FIG. 21. In a similar manner, the metallic vias 22-10 and 22-11 in FIG. 22 correspond to the shorts 21-11 and 21-13 in FIG. 21. Thus, these coils are shorted at both ends by the vias, therefore, the equivalent resistance $R_{equ}$ of all four coils is the parallel combination of the individual resistances of each coil.

A Spice simulation was performed to demonstrate the benefit of using multi-coil transformers in tank circuits. FIG. 23f provides the simulation conditions and are given in the table 23-5. The frequency of oscillation of the tank circuit was performed at 5 GHz. A 0.18 μm CMOS process technology operating at a VDD of 1.8V was assumed. To equalize the results of all four tank circuits, the output waveform of the tank circuits was designed to swing between 0.1V and 1.6V. In addition, the sheet resistance of all metal layers was assumed to be 0.08Ω/□.

The circuits that were simulated are illustrated in FIG. 23a-d. All circuits have a regenerative circuit consisting of two cross-couple inverters. Note that the equivalent resistance $R_{equ}$ of each inductor was portioned in half and positioned on each side of the corresponding inductor as R.

Figures 23A, 23B, 23C, 23D:
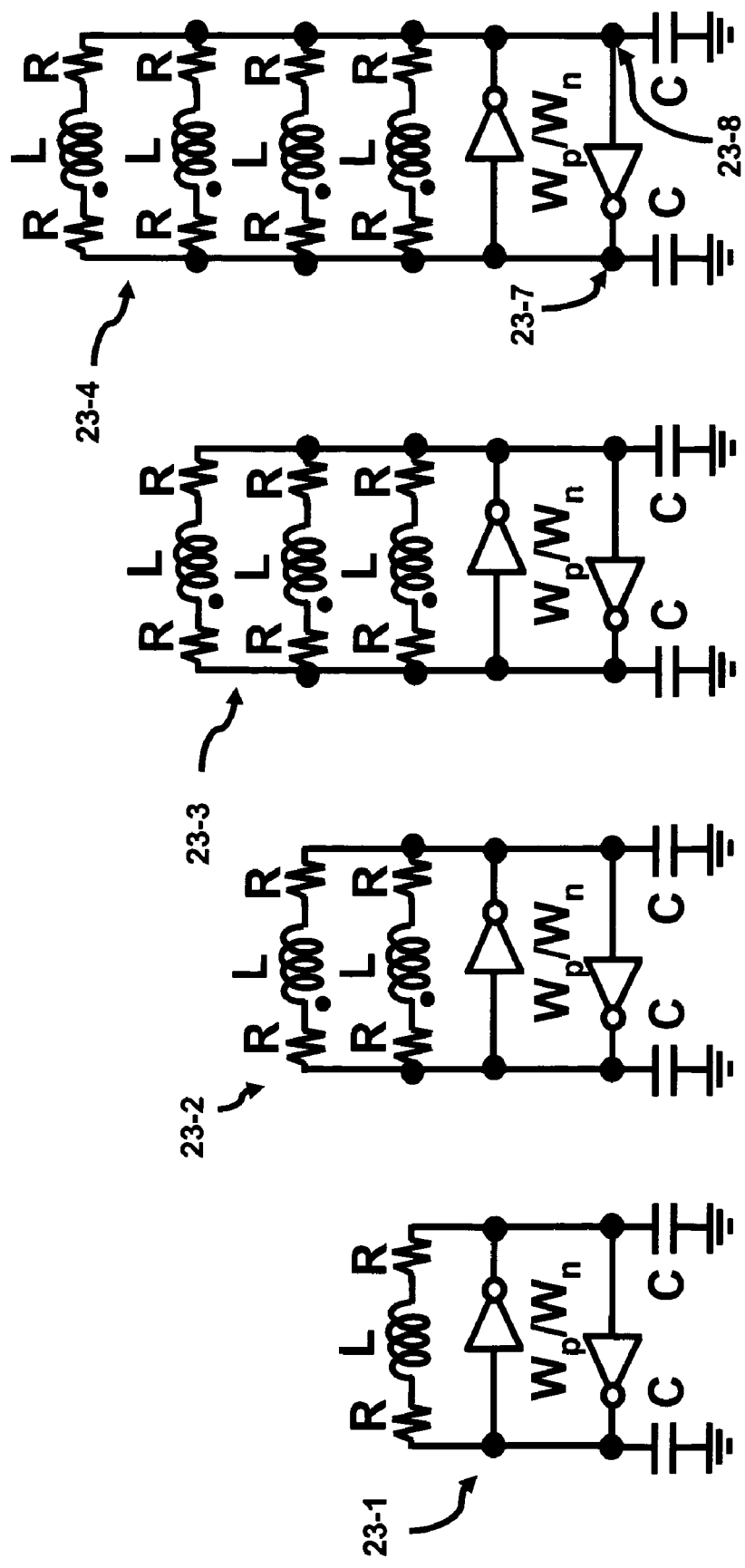
FIG. 23a provides the circuit description of a conventional LC tank circuit.
FIG. 23b-d illustrates the inventive circuit configuration of a two, three and four-coil transformer based tank circuit.

The conventional LC tank circuit 23-1 in FIG. 23a has only one inductor. The results of this circuit provide the reference point for the remaining circuits. In FIG. 23b, a transformer with two coils 23-2 having a parallel coupling is indicated. This is the one version of the TC tank circuit mentioned earlier. A three-coil transformer 23-3 is depicted in FIG. 23c. All inductors are arranged to have parallel coupling. Finally, FIG. 23d provides the multi inductor using four inductors 23-4.

Some of the results of the simulation 23-6 of the four different circuits are given in the table of FIG. 23e. The top row indicates the type of circuit that was simulated. The second column is the conventional LC tank circuit, the third column gives the results for the two-coil TC tank, while the remaining columns show the three and four-coil results. In order to achieve a 5 GHz operation with an output voltage swing varying from 0.1V to 1.6V, both the size of the inverters and the value of the capacitor had to be adjusted. The first row of 23-6 provides the required widths of the p-channel and n-channel of the inverter for the circuit just above their respective column. The second row indicated the capacitive load that can be driven in addition to the parasitic capacitance of the inverters.

Due to the large resistive loss of the inductor, the results for the conventional LC tank circuit indicate the need for a large inverter: 200 µm/100 µm, the self-capacitance of this large gate minimizes the amount of external load capacitance that can be driven. In this case, the value of C can only be 0.5 pF. In addition, because of the large inverters, the power dissipation is 21 mW.

The results of the two-coil TC tank circuit of 23-2 in FIG. 23b are more promising. Note that the size of the inverter in the regenerative circuit can be decreased by 60% or to 80/40 µm. This in turn increases the external load capacitance (1.6 pF) that can be driven by over 150% as compared to the conventional LC tank circuit (0.5 pF). Finally, the power dissipation dropped by nearly half to 10.7 mW.

The three-coil TC tank circuit of 23-3 in FIG. 23c, which used a three-coil transformer, improved the situation even further. The inverter size (50/25 µm) dropped to 25% of the conventional LC tank circuit. In addition, the capacitive load that can be driven increased by a factor of 4 (to 1.9 pF) and the power dropped to approximately ⅓ that of the conventional LC tank circuit (7.2 mW).

The last circuit 23-4 of the four-coil TC tank circuit in FIG. 23d continued the improvement, where the inverters dropped to a ⅕ of the size given in the conventional design. The power dissipation dropped almost to a ¼ as compared to the conventional LC tank circuit while the capacitive load increased by a factor of 4×.

Thus, the simulation results confirm the advantage of utilizing inductors connected in parallel to provide advantages in reducing the resistance of the equivalent inductance (given in the bottom row of FIG. 23e), increasing the quality factor Q, decreasing of the power dissipation of the circuit and increasing the amount of external capacitive load that can be driven into oscillation.

Figure 24:
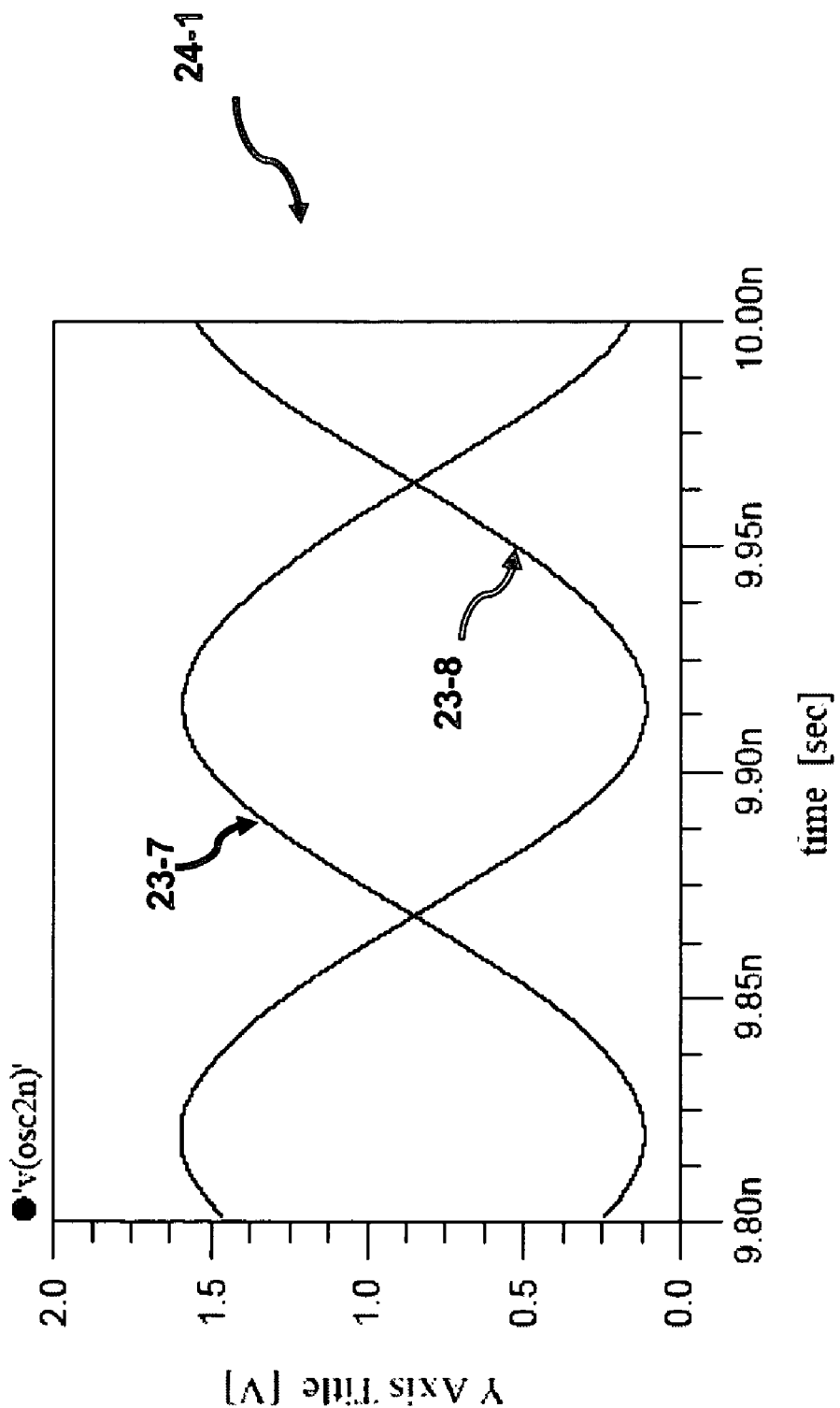
FIG. 24 presents the simulated 5 GHz waveforms of the inventive four-coil transformer circuit.

FIG. 24 provides the simulation results 24-1. The two sinusoidal outputs 23-7 and 23-8 correspond to the outputs of the circuit in FIG. 23d that is the four-coil transformer circuit. Note that the frequency of oscillation for these waveforms is approximately 5 GHz.

Figures 25A, 25B:
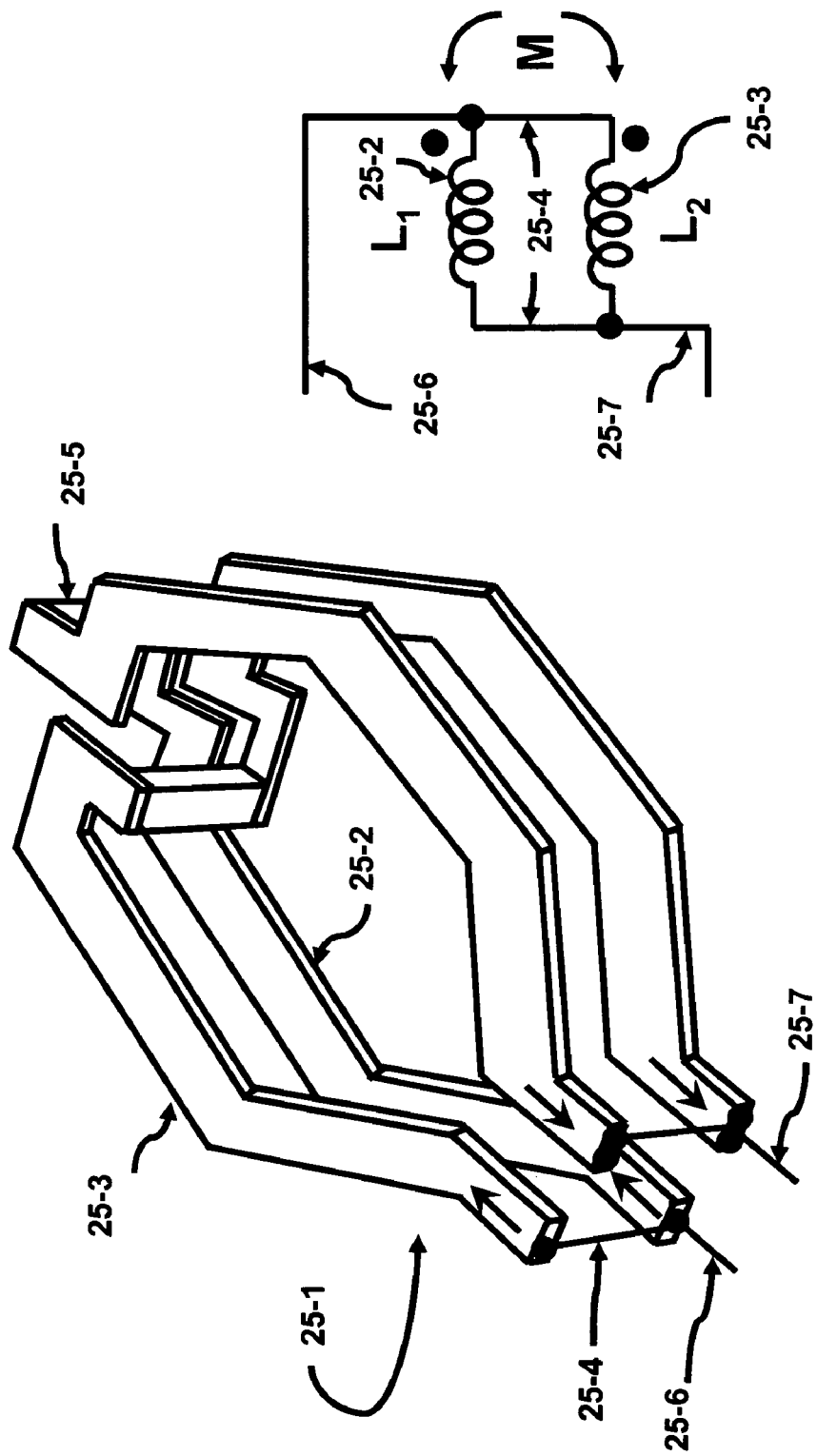

FIG. 25a illustrates another transformer structure 25-1. This transformer consists of two interwoven coils and offers a balanced differential interface. The first coil 25-2 receives current from port 25-6 and routes the current through the crossover 25-5 to the upper layer. The second coil 25-3 receives current from port 25-6 through the interconnect 25-4 and routes the current through the crossover 25-5 to the lower layer. The current approaches the end of the coils but the transformer has these two ends of its outputs shorted by 25-4. This current then exits the transformer at port 25-7.

FIG. 25b provides the schematic of the transformer identifying the same components in the circuit. The transformer has four ports. Two of the ports are shorted by the connection 25-4. Current from input port 25-6 enters coil $L_1$ and coil $L_2$ and exits at node 25-7. Note that this transformer has a parallel coupling configuration; this transformer will have an increased equivalent inductance according to the equation (11). In addition, the dots indicate this coupling. Thus, this is another representation where the two coils of a transformer are shorted together to effectively form one inductor.

Figure 26:
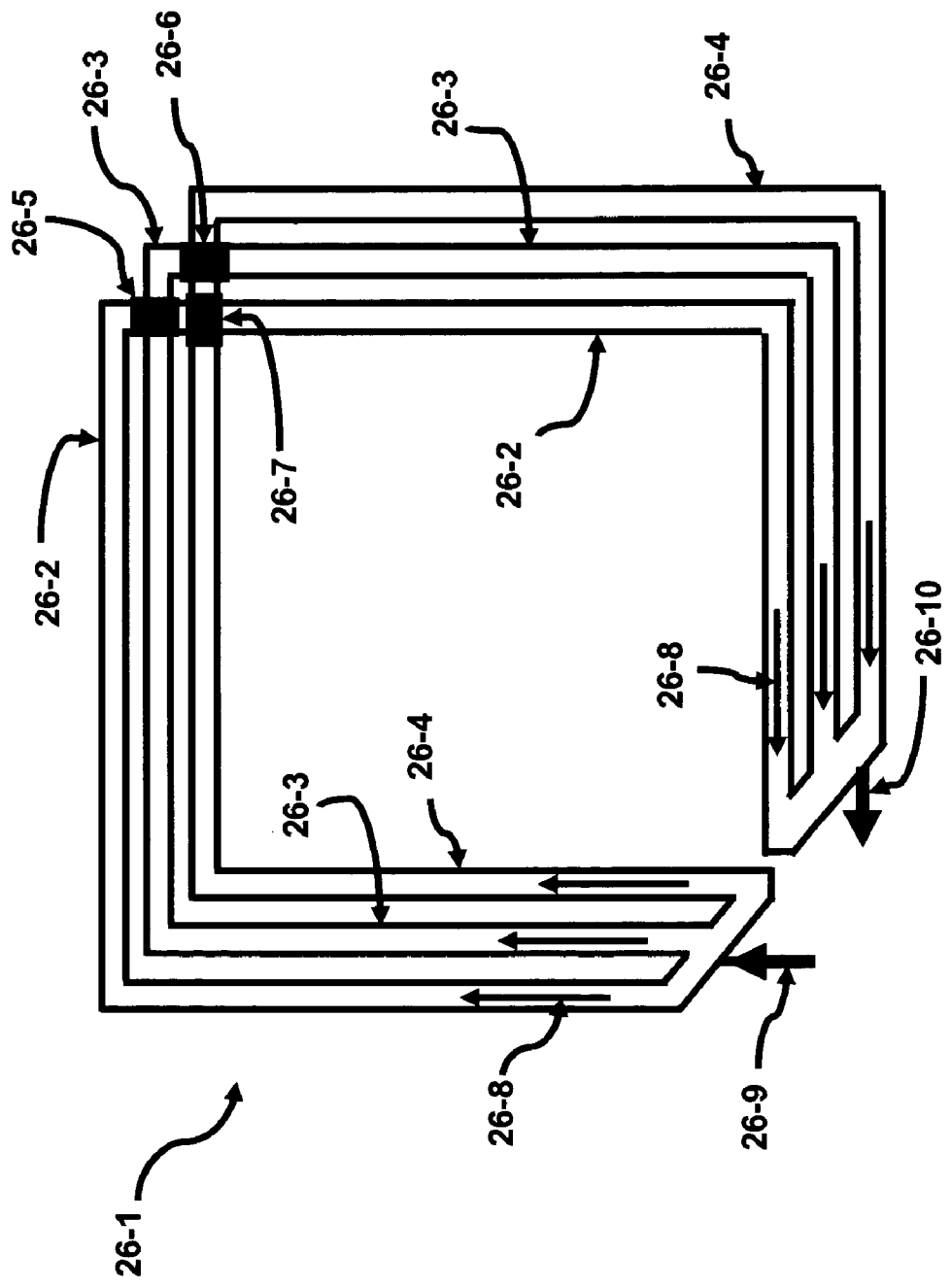
FIG. 26 illustrates the inventive physical structure of a multi-coiled transformer using a only two metal layers.

A horizontal multi-coil transformer 26-1 for a planar technology is depicted in FIG. 26. In this example, at least two metal layers are used. The upper metal layer contains the coils of the three co-linear inductors 26-2, 26-3 and 26-4 that is using thick metal with a sheet resistance of 0.01Ω/□. Each coil carries a current 26-8 from the primary source 26-9. This current passes to the other end of the transformer as current 26-8 and is collected and sunk a current 26-10.

In the upper right corner, the three coils route around one another. This is where metal vias are used to bridge the current from the upper metal layer to a lower metal layer to cross under the obstructing coil and use vias to redirect the current back to the upper metal layer. This structure is called a cross-under and redirects the current 26-8 down and under the coil fabricated in the top thick metal layer. For example, in coil 26-2, a cross-under 26-5 is used to continue the current flow 26-8 under the coil 26-3 and back to the coil 26-2. The middle coil 26-3 crosses under the coil 26-4 using the cross-under 26-6. Finally, the last coil 26-4 crosses under coil 26-2 using the cross-under 26-7. Note that each coil only has one cross-under in its entire path insuring that all the coils have a similar characteristic; for example, the resistance term in each coil is equalized.

FIG. 27a and FIG. 27b show the structure of the cross-under; in particular, the cross-under 26-7 of FIG. 26 is enlarged to allow a better description. In FIG. 27a, the top metal layer shows that thick metal is used for the inductors 26-2 and 26-4. However, as indicated in FIG. 26 and FIG. 27, the coil 26-4 crosses under coil 26-2 using the cross-under 26-7. As indicated in FIG. 27a, this is accomplished using vias 27-1 and one of the lower metal layers such as 27-2. Note that the metal layer 27-2 may be thinner. Thus, the sheet resistance of the lower metal layer may be more than that of the top layer. To help reduce the resistance of the cross-under, many vias are used to help cut down on their contribution to the resistance. Finally, FIG. 27b indicates the addition of another metal layer 27-4 and vias 27-3 to further reduce the resistance of the cross-under.

A circuit simulation was performed and the simulation conditions are illustrated in FIG. 28d. The sheet resistance of the coil was assumed to be 0.01Ω/□, which is the value typical for thick metal. The process was 0.18 µm operating at a voltage of 1.8V. The resistance of each via was 22Ω. For the cross-under, the sheet resistance of the thinner metal was assumed to be 0.08Ω/□.

FIG. 28 gives the simulation results when thick metal is used. Two circuits were simulated and are illustrated in FIG. 28. The first was the conventional LC tank circuit 28-1 given in FIG. 28a. The coil used was assumed to have one turn and had an inductance of 0.78 nH. This coil did not have any cross-under's and was fabricated using thick metal. The second simulation was performed on the three-coil TC tank circuit given in FIG. 28b. The layout of the multi-coil transformer given in FIG. 26 was used and thick metal was used.

The results for these two simulations are given in FIG. 28c. There is a factor of 4× in the size of the inverters between the conventional LC and the three-coil TC tank circuit. The amount of capacitance that the three-coil TC can drive increased 20%, while the power dissipation dropped by almost 3×. This occurred because the overall resistance of the single coil of the conventional LC tank circuit was reduced from 1.14Ω to 0.367Ω for the three-coil transformer used in the three-coil TC circuit.

Figure 29A:
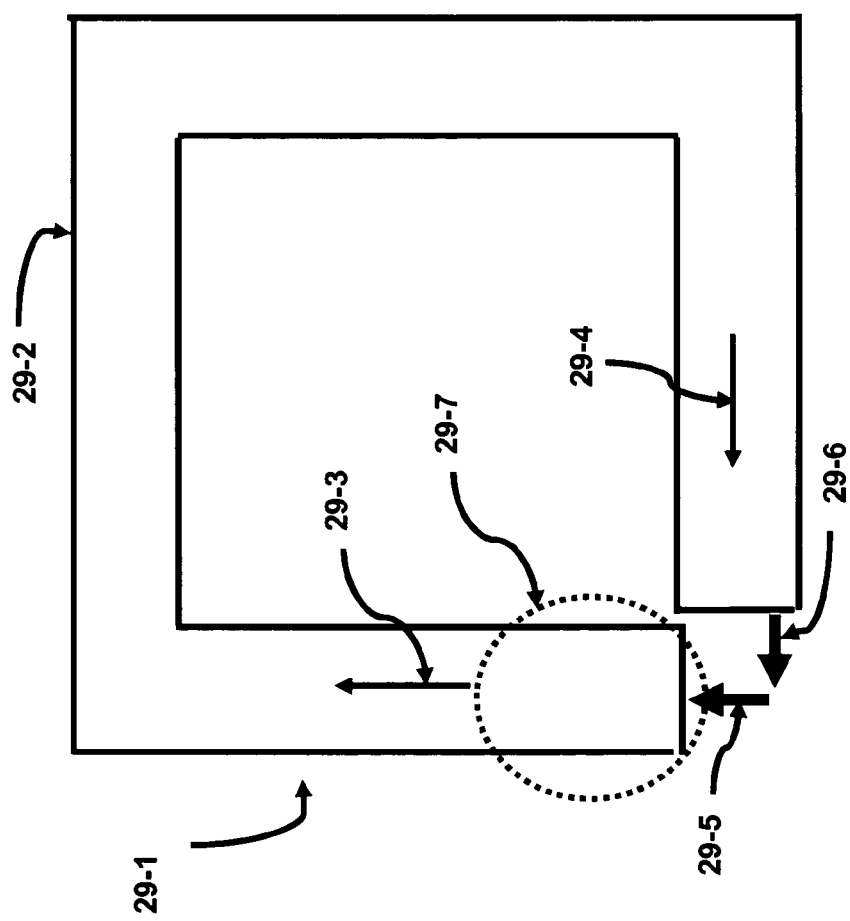
FIG. 29a depicts a conventional single turn planar inductor that occupies the same area as the three-coil inductor depicted in FIG. 26.

An analysis was performed to determine the value of the equivalent inductance and parasitic resistance of a conventional single turn coil shown in FIG. 29a that would occupy the same area as the three-coil transformer in FIG. 26. Because of scaling the values for the resistance of these two different structures are comparable. In addition, the inductances are comparable. The advantage of the horizontal multi-coil transformer is that the eddy current loss can be decreased in the multi-coil transformer.

Moving forward with this analysis, the conventional single turn coil of FIG. 29a is transformed into a multi-coil transformer to help show the reduction in the eddy current loss. The magnified region 29-7 which is given in FIG. 29b further illustrates how the multi-coil partition can reduce the eddy current loss.

As FIG. 29b illustrates, the single coil trace 29-7 is broken up into individual coils 29-8 separated by spaces 29-9. As pointed out previously, if the magnetic coupling is large between the coils, the parallel combination of the individual coils maintains a value of the initial inductance but decreases the overall parasitic resistance of each individual coil. In addition, because the width of the coil has decreased, the possibility of forming eddy currents is decreased helping to eliminate this portion of the loss. Assume for example, that the width of the space 29-9 is a micron or less while the width of the trace is on the order of a micron or more. These width dimension may be adjusted dependant on the electro-migration consideration. This structure causes the size of the eddy current loop to be limited to the width of the coil. However, the overall inductance can be better than that of the conventional single coil with a parasitic resistance that is similar to the single coil. Thus, the multi-transformer inventive technique used in horizontal planar inductors offers a decrease in eddy current loss.

FIG. 29c illustrates a magnified version of the region 29-10 in FIG. 29b that indicates the sidewall capacitance 29-11 between two coils 29-8. These capacitances could be quite large particularly due to the aspect ratio of the metal thickness. However, since all the coils are in parallel, the potential difference across each of the capacitors will remain constant. Thus, the structure of multi-coils transformers eliminates the concern of sidewall capacitance.

Figures 30A, 30B:
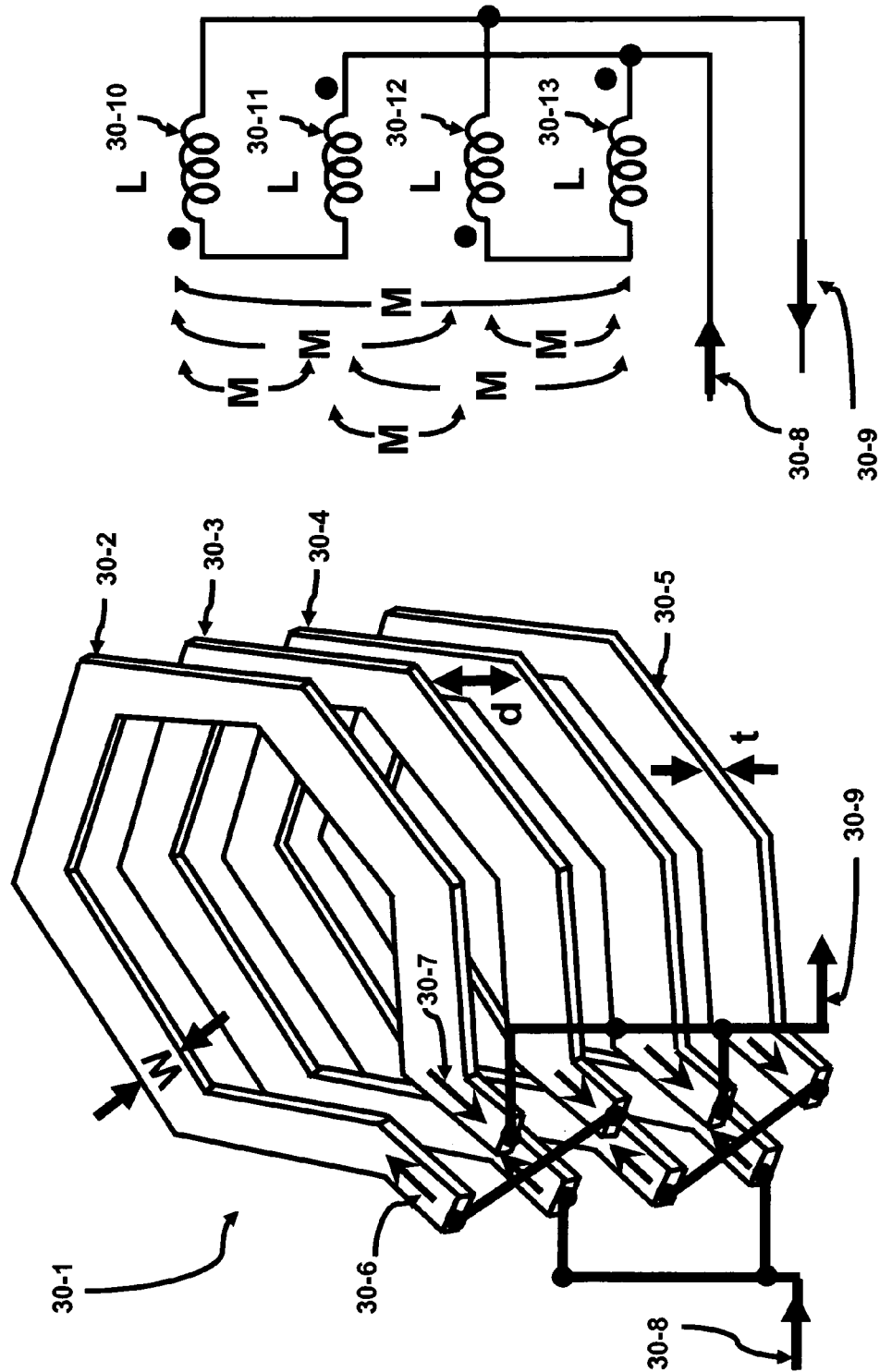
FIG. 30a depicts the physical representation of a parallel combination of two transformers in a planar technology in accordance with the present invention.
FIG. 30b presents the equivalent circuit schematic of the structure shown in FIG. 30a in accordance with the present invention.

FIG. 30a depicts a multi-coil transformer formed from a vertical planar inductor structure. This structure is similar to that given in FIG. 21a except that the connections at the ingress and egress ports are different. In this connection shown in FIG. 30a, there are two sets of helix coils. The first helix is formed using the bottom two coils 30-5 and 30-4 as can be determine by tracing from the left port carrying the current 30-3 into the ingress port of the coil 30-5. The egress port of coil 30-5 is shorted to the ingress port of coil 30-4 and then the egress port of coil 30-4 is connected to the port carrying the current 30-9. The second helix follows a similar trajectory in the top two coils 30-3 and 30-2. Furthermore, note that both helixes are connected in parallel. That is, the left port carrying current 30-8 connects to the ingress ports of coils 30-3 and 30-5. The right port that carries the return current 30-9 connects to the egress ports of coils 30-2 and 30-4. This type of structure offers the ability to increase the inductance since N=2, and decrease the resistance since two helixes are in parallel. Furthermore, each of these coils can be segregated into many segmented coils (as shown in FIG. 29b) to decrease the eddy current losses.

A circuit representation of the structure in FIG. 30a is given in FIG. 30b. Assume that all inductances are equal to L. The coils; 30-2, 30-3, 30-4 and 30-5 are represented by the inductances 30-10, 30-11, 30-12 and 30-13, respectively. The first helix formed by the coils 30-4 and 30-5 are represented by the inductors 30-12 and 30-13. Note that the two inductors 30-12 and 30-13 are in series. The inductors 30-10 and 30-12 form the second helix where both of these inductors are in series as well. Finally, both of these helixes are connected in parallel to lower their effective resistance but still maintaining the higher inductance because of the mutual magnetic coupling.

Figure 31:
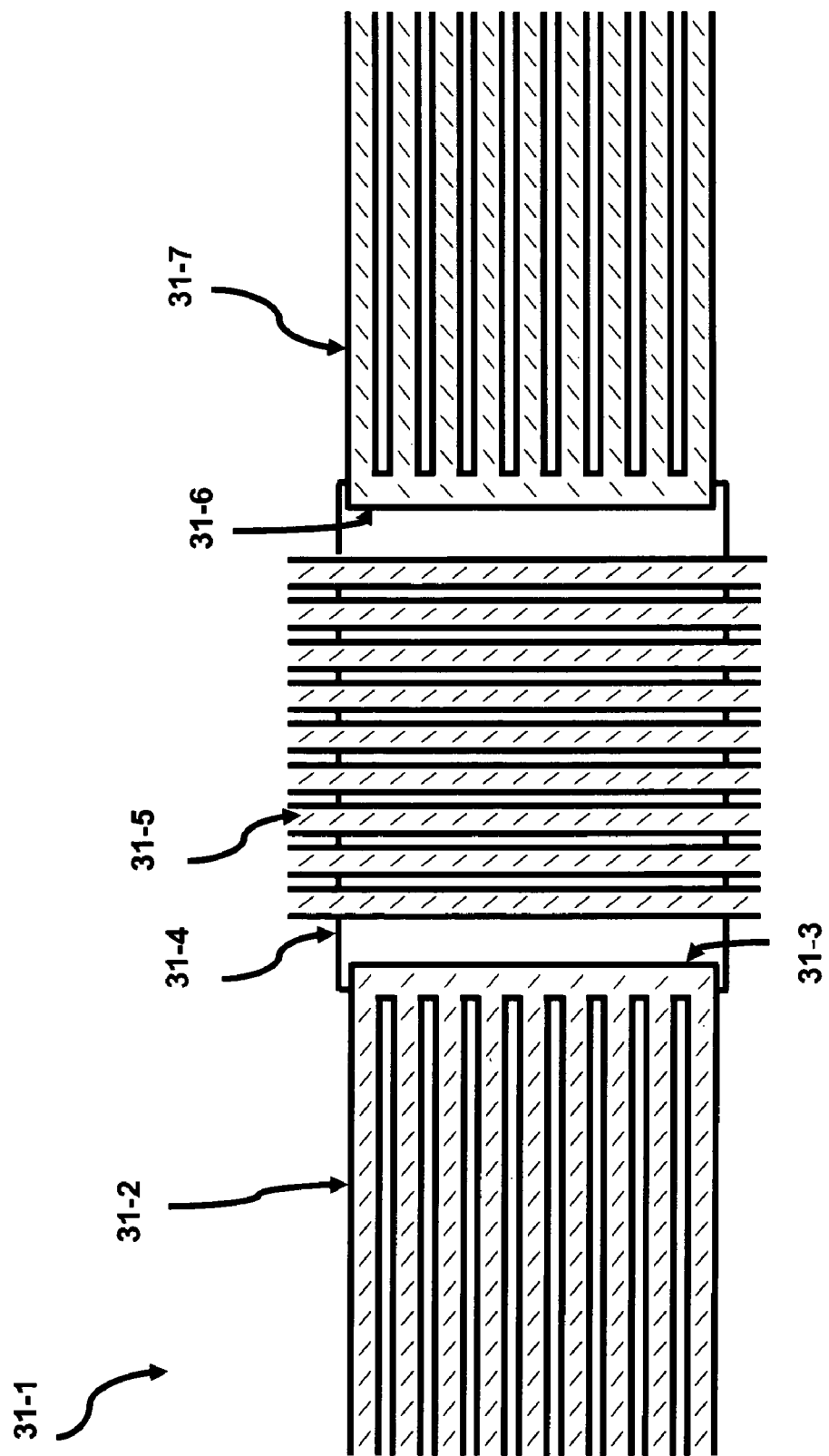
FIG. 31 presents a cross-under connecting two conductors with a reduced eddy-current loss in accordance with the present invention.

Breaking up a wire into many parallel runners to help reduce eddy current loss is show in FIG. 31. The multi-coil runner 31-5 crosses from top to bottom and crosses over the bridge 31-4 which is part of the cross-under 31-1. The bridge 31-4 is used to connect the multi coil runner from the left 31-2 to the multi coil runner on right 31-7. The parallel coils 31-2 are combined into one solid unit 31-3. Vias connect the solid unit 31-3 to the bridge 31-4, then vias are again used to connect the bridge 31-4 to the solid unit 31-6 of the sets of parallel coils 31-7 located on the right. Thus, whenever a multi-coil runner makes a connection to another metal layer, the runner are combined into one solid unit for easy access to vias.

Figure 32:
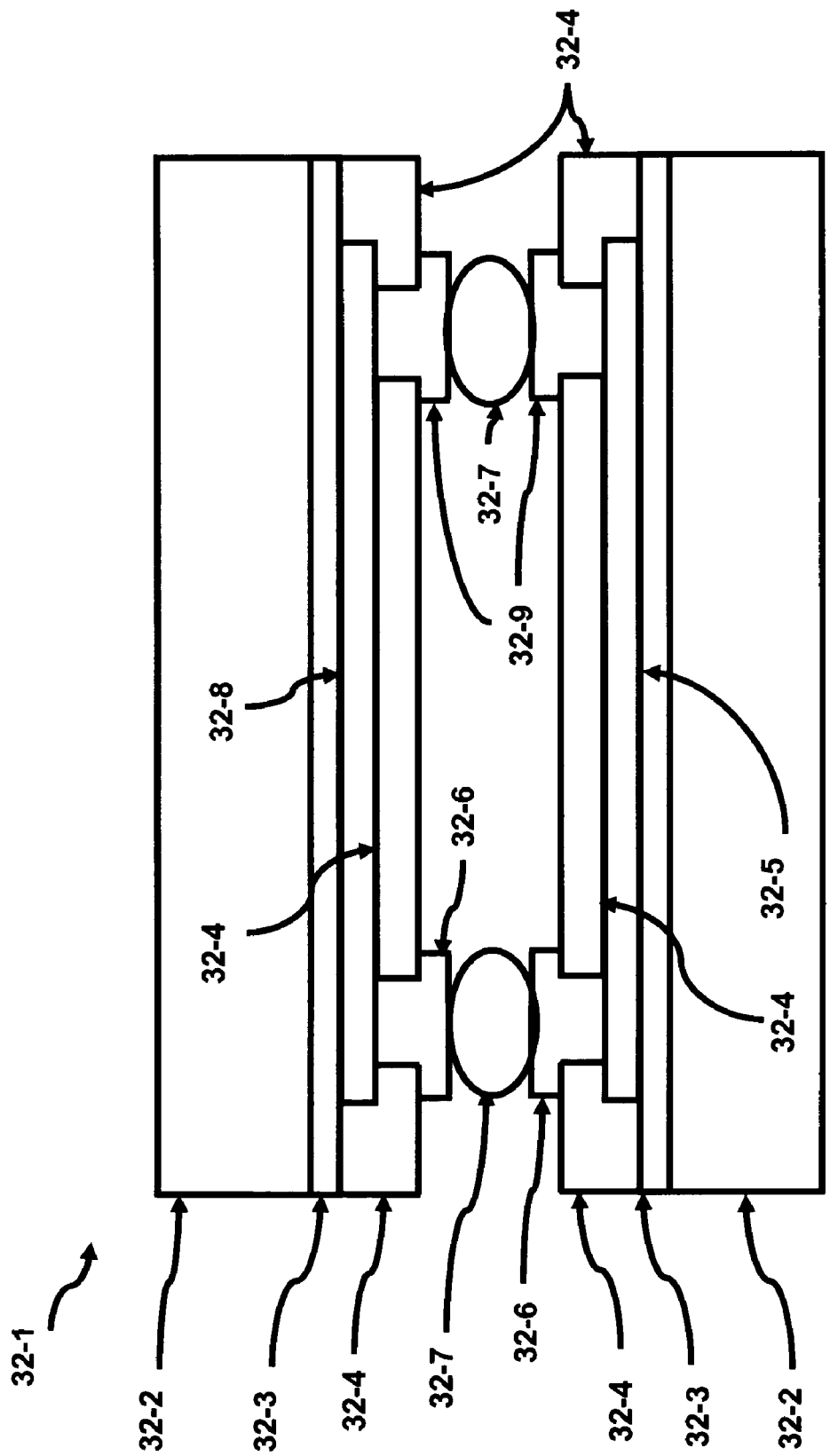
FIG. 32 illustrates the connection of two coils each on a separate die that are connected together using solder bumps in a MCM technology in accordance with the present invention.

FIG. 32 illustrates a MCM (Multi-Chip Module) 32-1 containing an inductor on each of the two die making up the MCM. The cross-sectional view has been simplified to provide the crux of the idea. For example, only one metal layer is shown on each die but those skilled in the art will appreciate that additional metal and dielectric layers can be added to the diagram without altering the idea. The lower die contains a substrate 32-2 and a dielectric layer 32-3 has been deposited on the substrate. A metal layer 32-5 with the shape of a coil (not shown) has been patterned on top of the dielectric layer 32-3. The coil 32-5 has its first lead electrically connected to a via and a metal layer 32-6. The second lead of the coil is electrically connected to the via and a metal layer 32-9. The solder bumps 32-7 connect the lower die to the upper die.

The upper die has a similar structure as the lower die to simplify the description and many of the numerals describing the features are the same. A dielectric layer 32-3 is deposited on the substrate 32-2. A metal layer 32-8 with the shape of a coil (not shown) has been patterned on top of the dielectric layer 32-3. The coil 32-8 has its first lead electrically connected to a first via and a metal layer 32-6. The second lead of the coil is electrically connected to a second via and a metal layer 32-9. The solder bumps 32-7 not only provide mechanical support to the two die but electrically connect the two coils in parallel as well. These two coils are now electrically connected in parallel and are magnetically coupled due to their proximity to each other.

Finally, it is understood that the above description are only illustrative of the principle of the current invention. In accordance with these principles, those skilled in the art may devise numerous modifications without departing from the spirit and scope of the invention. For example, the multi-coil transformer element can be utilized in various circuits such as filters, antennas, and other RF circuits. In another example, the MOS devices illustrated in the regenerative circuit can be replaced by BJT device to provide a negative impedance and maintain the oscillations.

The invention claimed is:

1. A planar inductor comprising:
   a plurality of substrates;
   a plurality of dielectric layers;
   a first port and a second port;
   a coil comprising:
      a metallic trace patterned to form the coil; and
      each end of the coil is coupled to a first lead and a second lead, respectively;
   at least two coils;
   the first coil is on a first dielectric layer on a first substrate;
   the second coil is on a different dielectric layer on a second substrate;
   the first lead of each coil is coupled to the first port; and
   the second lead of each coil is coupled to the second port.

2. The inductor of claim 1 further comprising;
   at least two coils positioned over one another.

3. The inductor of claim 1 further comprising;
   at least one coil having a magnetic coupling to the second coil.

4. The inductor of claim 1 whereby;
   the coils can be multi-turn coils.

5. The inductor of claim 1 further comprising:
   a plurality of solder bumps; whereby
   the first lead of the second coil is coupled to the first lead of the first coil using at least one solder bump, and
   the second lead of the second coil is coupled to the second lead of the first coil using at least one different solder bump.

6. The inductor of claim 1 further comprising:
   a plurality of vias;
   at least one via couples the first lead of each coil to the first port; and
   at least one different via couples the second lead of each coil to the second port.

7. The inductor of claim 1, whereby the first substrate is connected to the second substrate using an MCM (Multi-Chip Module) technology.

8. The inductor of claim 1, wherein the coil comprises:
   at least one metal trace;
   at least one portion of the metal trace is patterned on a first dielectric layer;
   the remaining portions of the metal trace are patterned on the first dielectric layer or at least one different dielectric layer;
   all portions are coupled in a series circuit to form the coil; and
   each end of the coil is coupled to a first lead and a second output lead, respectively.

9. The inductor of claim 7, wherein the coil comprises:
   at least two coils in parallel.

10. A planar inductor comprising:
    a first coil formed on a first substrate;
    a second coil formed on a second substrate; wherein
    each coil has a first lead and a second lead;
    a plurality of solder bumps; whereby
       the first lead of the first coil is coupled to the first lead of the second coil using at least one solder bump, and
       the second lead of the first coil is coupled to the second lead of the first coil using at least one different solder bump.

11. The inductor of claim 10, wherein the coil comprises:
    a metallic trace patterned to form the coil; and
    each end of the coil is coupled to the first lead and the second lead, respectively.

12. The inductor of claim 11, wherein the metallic trace comprises:
    at least one metal trace;
    at least one portion of the metal trace is patterned on a first dielectric layer;
    the remaining portions of the metal trace are patterned on the first dielectric layer or at least one different dielectric layer;
    all portions are coupled in a series circuit to form the coil; and
    each end of the coil is coupled to a first lead and a second output lead, respectively.

13. The inductor of claim 10, wherein the first coil has a magnetic coupling to the second coil.

14. The inductor of claim 10, whereby the coils can be multi-turn coils.

15. The inductor of claim 10, wherein the two coils are positioned over one another.

16. The inductor of claim 10, wherein the coil in each substrate can be formed of two or more coils connected in parallel.

17. The inductor of claim 16, wherein a plurality of vias;
    at least one via couples the first lead of two coils on the same substrate; and
    at least one different via couples the second lead of these two coils.

18. The inductor of claim 10, wherein the first substrate is connected to the second substrate using an MCM (Multi-Chip Module) technology.

* * * * *